(12) United States Patent
Sugimoto et al.

(10) Patent No.: US 12,154,615 B2
(45) Date of Patent: Nov. 26, 2024

(54) SEMICONDUCTOR STORAGE DEVICE

(71) Applicant: Kioxia Corporation, Tokyo (JP)

(72) Inventors: Takeshi Sugimoto, Kamakura Kanagawa (JP); Takayuki Miyazaki, Tokyo (JP)

(73) Assignee: Kioxia Corporation, Tokyo (JP)

( * ) Notice: Subject to any disclaimer, the term of this patent is extended or adjusted under 35 U.S.C. 154(b) by 163 days.

(21) Appl. No.: 18/081,265

(22) Filed: Dec. 14, 2022

(65) Prior Publication Data
US 2023/0410886 A1    Dec. 21, 2023

(30) Foreign Application Priority Data
Jun. 21, 2022   (JP) .................. 2022-099933

(51) Int. Cl.
*G11C 11/4091*   (2006.01)
*G11C 11/4096*   (2006.01)
*G11C 11/4099*   (2006.01)

(52) U.S. Cl.
CPC ...... *G11C 11/4091* (2013.01); *G11C 11/4096* (2013.01); *G11C 11/4099* (2013.01)

(58) Field of Classification Search
CPC ............ G11C 11/4091; G11C 11/4096; G11C 11/4099; G11C 5/025; G11C 7/14; G11C 8/14; G11C 11/4094; G11C 11/4097; G11C 7/18; G11C 5/063; G11C 7/1051; G11C 11/4063
See application file for complete search history.

(56) References Cited

U.S. PATENT DOCUMENTS

| 7,929,337 B2 | 4/2011 | Choi et al. |
| 9,502,080 B2 | 11/2016 | Douzaka |
| 10,418,074 B2 | 9/2019 | Sugimoto et al. |
| 2007/0263423 A1* | 11/2007 | Scheuerlein ............ G11C 7/18 365/63 |
| 2019/0103440 A1* | 4/2019 | Inaba ................. H10N 70/8833 |
| 2020/0302993 A1* | 9/2020 | Tanaka ................ G11C 11/4076 |
| 2022/0108985 A1* | 4/2022 | Nagatsuka .......... H01L 27/1225 |
| 2023/0030605 A1* | 2/2023 | Lee ......................... G11C 7/18 |

FOREIGN PATENT DOCUMENTS

JP           2019-046514 A       3/2019

* cited by examiner

*Primary Examiner* — Jerome Leboeuf
(74) *Attorney, Agent, or Firm* — Foley & Lardner LLP

(57) ABSTRACT

A memory includes first cell layers respectively including first cells, and a second cell layer including dummy cells. A first wire is connected to the first cells arrayed in a first direction. A second wire is connected to the dummy cells arrayed in the first direction. A third wire is connected to the first cells and one of the dummy cells arrayed in a second direction. A fourth wire is connected to the third wires arrayed in a third direction. A first voltage is applied to a selected first wire when reading data from a selected first cell, and transmits a read data to a selected fourth wire connected to the selected first cell. A reference voltage is applied to a non-selected fourth wire. A second voltage is applied to a selected second wire provided with the dummy cell between the selected second wire and the non-selected fourth wire.

17 Claims, 18 Drawing Sheets

| DATA | t 1 | | t 3 |
|---|---|---|---|
| | $V_S$ | $V_{BL}$ | $V_S = V_{BL}$ |
| 1 | VDD | VDD/2 | VDD/2 + $V_{sig}$ |
| 0 | 0 V | VDD/2 | VDD/2 − $V_{sig}$ |

WDRV1,WDRV2

SEMICONDUCTOR STORAGE DEVICE

CROSS REFERENCE TO RELATED APPLICATIONS

This application is based upon and claims the benefit of priority from the prior Japanese Patent Application No. 2022-099933, filed on Jun. 21, 2022, the entire contents of which are incorporated herein by reference.

FIELD

The embodiments of the present invention relate to a semiconductor storage device.

BACKGROUND

A DRAM (Dynamic Random Access Memory) in which memory cells are arrayed three-dimensionally has been developed. In the DRAM, a voltage according to data from the memory cell is compared with a reference signal to detect the logic of the data.

It may be difficult in a three-dimensional memory cell array to detect data from the memory cell.

DETAILED DESCRIPTION

Figure 1:
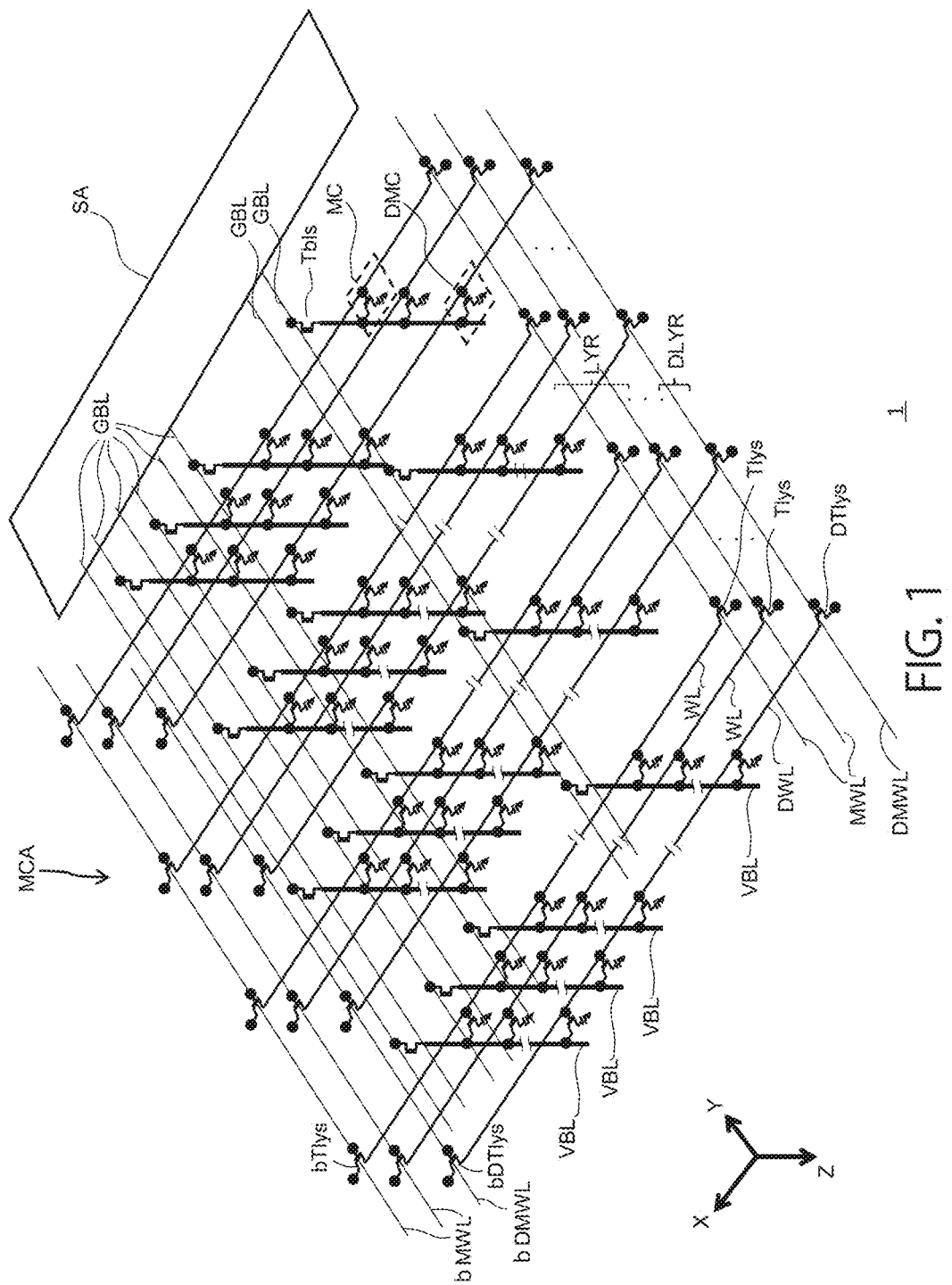
FIG. 1 is a schematic perspective view illustrating a configuration example of a semiconductor storage device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor storage device according to the present embodiment includes: a plurality of first cell layers, each of which includes a plurality of first cells arrayed in a first plane and used as memory cells; and at least one second cell layer stacked on the first cell layer, and including a plurality of second cells arrayed in a second plane, the second cells not being used as memory cells. Each of a plurality of first wires is connected to the first cells arrayed in a first direction in the first plane. Each of a plurality of second wires is connected to the second cells arrayed in the first direction in the second plane. Each of a plurality of third wires is connected to the first cells and the second cell arrayed in a second direction in which the first and second cell layers are stacked. Each of a plurality of fourth wires is connected to the third wires arrayed in a third direction intersecting the first and second directions. The control circuit applies a first voltage to a selected first wire of the first wires when reading data from a selected cell selected from among the first cells, the selected first wire being connected to the selected cell, and transmits a read voltage according to the data to a selected fourth wire of the fourth wires, the selected fourth wire being connected to the selected cell. The control circuit transmits a reference voltage used as a reference for detecting the read voltage to a non-selected fourth wire of the fourth wires, other than the selected fourth wire. The control circuit applies a second voltage to a selected second wire of the second wires, the selected second wire being provided with the second cell between the selected second wire and the non-selected fourth wire.

First Embodiment

FIG. 1 is a schematic perspective view illustrating a configuration example of a semiconductor storage device 1 according to a first embodiment. The semiconductor storage device 1 according to the present embodiment is, for example, a DRAM including a three-dimensional memory cell array MCA in which memory cells MC and dummy cells DMC are arrayed three-dimensionally. The memory cell MC is used as a memory cell that stores 1-bit data or multi-bit data therein. The dummy cell DMC has the same configuration as that of the memory cell MC although the dummy cell DMC does not store data therein. Accordingly, the dummy cell DMC is not used as a memory cell.

A plurality of memory cells MC are arranged in a planar matrix array in the X-Y plane, and make up a single memory cell layer LYR. A plurality of memory cell layers LYR are stacked in the Z direction. In the memory cell array MCA, the memory cell layers LYR are stacked substantially parallel to each other. Accordingly, the memory cells MC are arrayed three-dimensionally.

A plurality of dummy cells DMC are also arranged in a planar matrix array in the X-Y plane, and make up a single dummy cell layer DLYR. In the memory cell array MCA, the dummy cell layer DLYR is stacked in the Z direction on top of the upper layer, below the lower layer, or in the middle of a plurality of stacked memory cell layers LYR. The dummy cell layer DLYR is stacked on the memory cell layer LYR substantially parallel to it. It is sufficient that at least one dummy cell layer DLYR is provided for one memory cell array MCA. In the first embodiment, one dummy cell layer DLYR is provided in the memory cell array MCA.

The semiconductor storage device 1 according to the present embodiment includes the memory cell array MCA, a plurality of word lines WL, a plurality of dummy word lines DWL, a plurality of bit lines VBL, a plurality of global bit lines GBL, a plurality of bit-line selection transistors Tbls, a plurality of memory-cell layer selection transistors Tlys and bTlys, and a plurality of dummy-cell layer selection transistors DTlys and bDTlys.

The word lines WL extend in the X direction in the plane of the memory cell layer LYR, and are connected to the memory cells MC arrayed in the X direction. In the memory cell layer LYR, the word lines WL are arrayed in the Y direction. The word lines WL are connected at their one end to a word line driver (not illustrated) through the memory-cell layer selection transistors Tlys. The word lines WL are connected at the other end to a non-selective voltage source VUM of the word lines WL through the memory-cell layer selection transistors bTlys. The word lines WL are configured identically in each of the memory cell layers LYR.

The dummy word lines DWL extend in the X direction in the plane of the dummy cell layer DLYR, and are connected to the dummy cells DMC arrayed in the X direction. In the dummy cell layer DLYR, the dummy word lines DWL are arrayed in the Y direction. The dummy word lines DWL are connected at their one end to a dummy word line driver (not illustrated) through the dummy-cell layer selection transistors DTlys. The dummy word lines DWL are connected at the other end to the non-selective voltage source VUM through the dummy-cell layer selection transistors bDTlys.

A layer selection word line MWL is connected to gates of the memory-cell layer selection transistors Tlys, and brings the memory-cell layer selection transistors Tlys into a conductive state when the memory cell layer LYR is selected. A layer selection word line bMWL is connected to gates of the memory-cell layer selection transistors bTlys, and brings the memory-cell layer selection transistors bTlys into a non-conductive state when the memory cell layer LYR is selected. The layer selection word line bMWL transmits a signal of opposite phase (inverse logic) to the layer selection word line MWL. Accordingly, when either the memory-cell layer selection transistors Tlys or bTlys are in a conductive state, the other memory-cell layer selection transistors are in a non-conductive state.

A dummy-layer selection word line DMWL is connected to gates of the dummy-cell layer selection transistors DTlys, and brings the dummy-cell layer selection transistors DTlys into a conductive state when the dummy memory cell layer DLYR is selected. A dummy-layer selection word line bDMWL is connected to gates of the dummy-cell layer selection transistors bDTlys, and brings the dummy-cell layer selection transistors bDTlys into a non-conductive state when the dummy memory cell layer DLYR is selected. The dummy-layer selection word line bDMWL transmits a signal of opposite phase (inverse logic) to the dummy layer selection word line DMWL. Accordingly, when either the dummy-cell layer selection transistors DTlys or bDTlys are in a conductive state, the other dummy-cell layer selection transistors are in a non-conductive state. In the present embodiment, since there is only a single dummy cell layer DLYR, the dummy cell layer DLYR is always in a selected state in a read operation. Hereinafter, the memory-cell layer selection transistors Tlys and bTlys and the dummy-cell layer selection transistors DTlys and bDTlys are sometimes referred to simply as "layer selection transistors".

The bit lines VBL extend in a direction in which a plurality of memory cell layers LYR and at least one dummy cell layer DLYR are stacked (Z direction). Each of the bit lines VBL is connected to a plurality of memory cells MC and at least one dummy cell DMC that are arrayed in the Z direction. The plurality of memory cells MC and the at least one dummy cell DMC that are arrayed in the Z direction are connected to their common bit line VBL to form a memory string. In a plan view as viewed from the Z direction, the bit lines VBL are arranged two-dimensionally in a matrix array in the X-Y direction corresponding to the memory cells MC in the memory cell layer LYR. The bit lines VBL are connected at their one end to the global bit lines GBL through the bit-line selection transistors Tbls.

The global bit lines GBL extend in the Y direction in the X-Y plane, and are connected through the bit-line selection transistors Tbls to one end of the bit lines VBLs arrayed in the Y direction. The bit lines VBL arrayed in the Y direction are connected to their common global bit line GBL. The global bit lines GBL are arrayed in the X direction. The global bit lines GBL are connected at their one end to a sense amplifier SA. The global bit lines GBL are provided to be shared between the memory cell layers LYR and the dummy cell layer DLYR in the memory cell array MCA.

Figure 2:
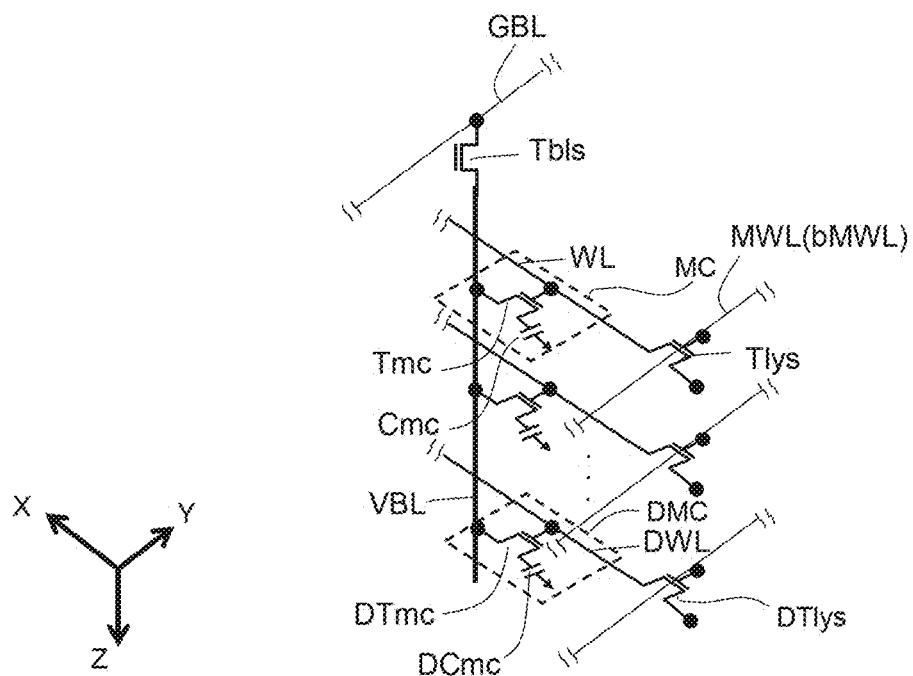
FIG. 2 is a schematic perspective view illustrating a configuration of a single bit line and its surroundings.

The sense amplifier SA receives a read voltage according to the data stored in a selected memory cell MC through a selected global bit line GBL, and receives a reference voltage according to a reference signal from a non-selected global bit line GBL. Furthermore, the sense amplifier SA compares the read voltage with the reference voltage, and amplifies the voltage difference between them so as to detect the logic of the data. FIG. 2 is a schematic perspective view illustrating a configuration of a single bit line VBL and its surroundings. Each of the memory cells MC includes a cell transistor Tmc and a cell capacitor Cmc. A gate of the cell transistor Tmc is connected to any of the word lines WL. Either a source or a drain of the cell transistor Tmc is connected to the bit line VBL, and the other is connected to one end of the cell capacitor Cmc. The cell capacitor Cmc is connected between the other of the source and the drain of the cell transistor Tmc, and a reference voltage source (for example, the ground or an intermediate voltage VDD/2 which is described later). The dummy cell DMC may have basically the same configuration as that of the memory cell MC. Therefore, the dummy cell DMC includes a dummy cell transistor DTmc and a dummy cell capacitor DCmc. The dummy cell transistor DTmc may have the same configuration as that of the cell transistor Tmc. The dummy cell capacitor DCmc may have the same configuration as that of the cell capacitor Cmc. For example, the dummy cell transistor DTmc may have a gate size (gate width and gate length) that is substantially the same as that of the cell transistor Tmc. The dummy cell capacitor DCmc may have an electrode size that is substantially the same as that of the cell capacitor Cmc. The gate of the dummy cell transistor DTmc is connected to any of the dummy word lines DWL. Either a source or a drain of the dummy cell transistor DTmc is connected to the bit line VBL, and the other is connected to one end of the dummy cell capacitor DCmc. The dummy cell capacitor DCmc is connected between the other of the source and the drain of the dummy cell transistor DTmc, and the reference voltage source (for example, the ground or the intermediate voltage VDD/2 which is described later).

The memory cell MC can store logical data therein by accumulating an electric charge in the cell capacitor Cmc through the cell transistor Tmc, or by releasing the electric charge from the cell capacitor Cmc.

Figure 3:
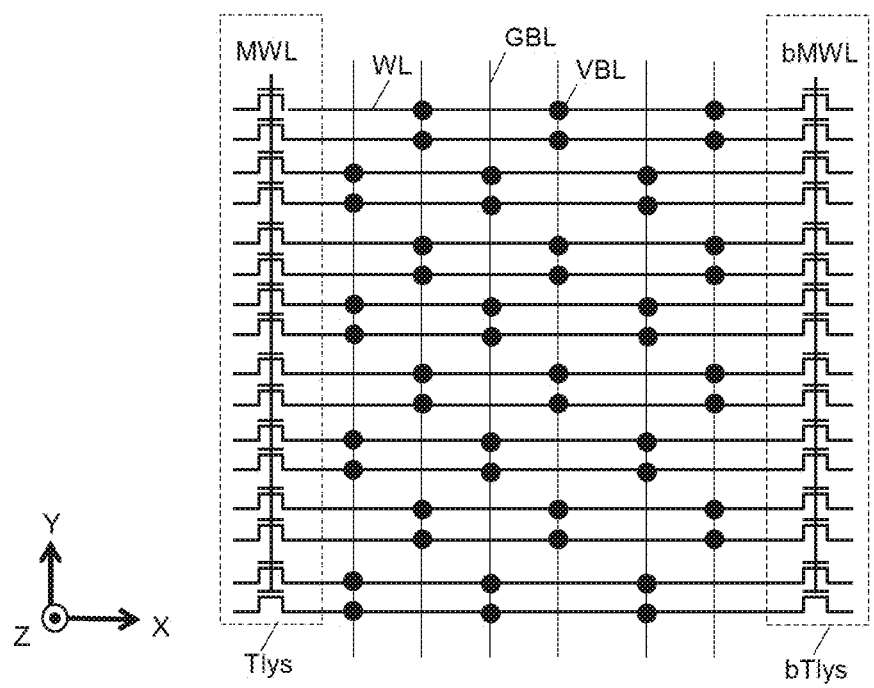
FIG. 3 is a schematic plan view illustrating a configuration example of the memory cell array.

FIG. 3 is a schematic plan view illustrating a configuration example of the memory cell array MCA. FIG. 3 illustrates a plan view as viewed from the Z direction. In the present embodiment, the bit lines VBL are provided corresponding to the intersection locations of the word lines WL and the global bit lines GBL. However, the bit lines VBL are not provided at all of the intersection locations, but are arranged at intervals or intermittently. For example, the bit lines VBL are arranged at every second intersection location of the above intersection locations arrayed in the X direction along the word lines WL. In addition, the bit lines VBL are arranged two by two at the above intersection locations arrayed in the Y direction along the global bit lines GBL at an interval of two intersection locations in between. Opposite ends of the word lines WL are connected to the memory-cell layer selection transistors Tlys and to the memory-cell layer selection transistors bTlys.

The bit line VBL penetrates the memory cell layers LYR and the dummy cell layer DLYR that are stacked in the Z direction, and is shared by these layers. Therefore, in a plan view as viewed from the Z direction, the arrangement of the bit lines VBL is identical in the memory cell layers LYR and the dummy cell layer DLYR that are stacked on top of another.

The bit lines VBL are arranged at intervals or intermittently at the intersection locations of the word lines WL and the global bit lines GBL. With this arrangement, a reference signal can be generated in the memory cell array MCA in which the selected memory cell MC is included. Such a bit line configuration (Folded bit line configuration) as described above is explained later in more detail with reference to FIG. 8.

Figure 4:
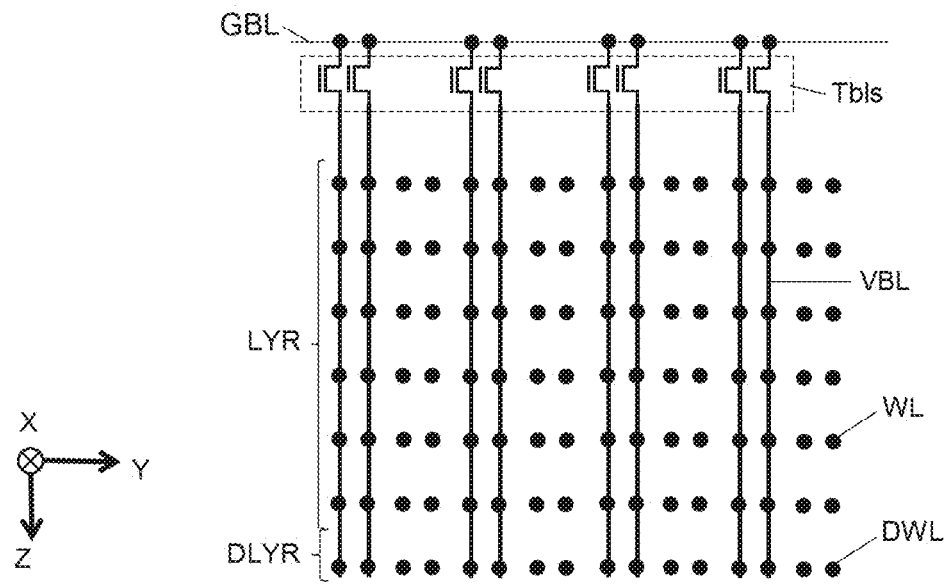
FIG. 4 is a schematic side view illustrating a configuration example of the memory cell array.

FIG. 4 is a schematic side view illustrating a configuration example of the memory cell array MCA. FIG. 4 illustrates a configuration as viewed from the X direction. In the present embodiment, for example, the bit lines VBL are arranged two by two at the above intersection locations arrayed in the Y direction along the global bit lines GBL at an interval of two intersection locations in between. The bit lines VBL are connected through the bit-line selection transistors Tbls to the global bit lines GBL.

Each of the word lines WL is wired corresponding to each array of the memory cells MC in the X direction. In the present embodiment, a plurality of memory cell layers LYR are stacked, and below the lowermost layer thereof, a single dummy cell layer DLYR is provided.

Figure 5:
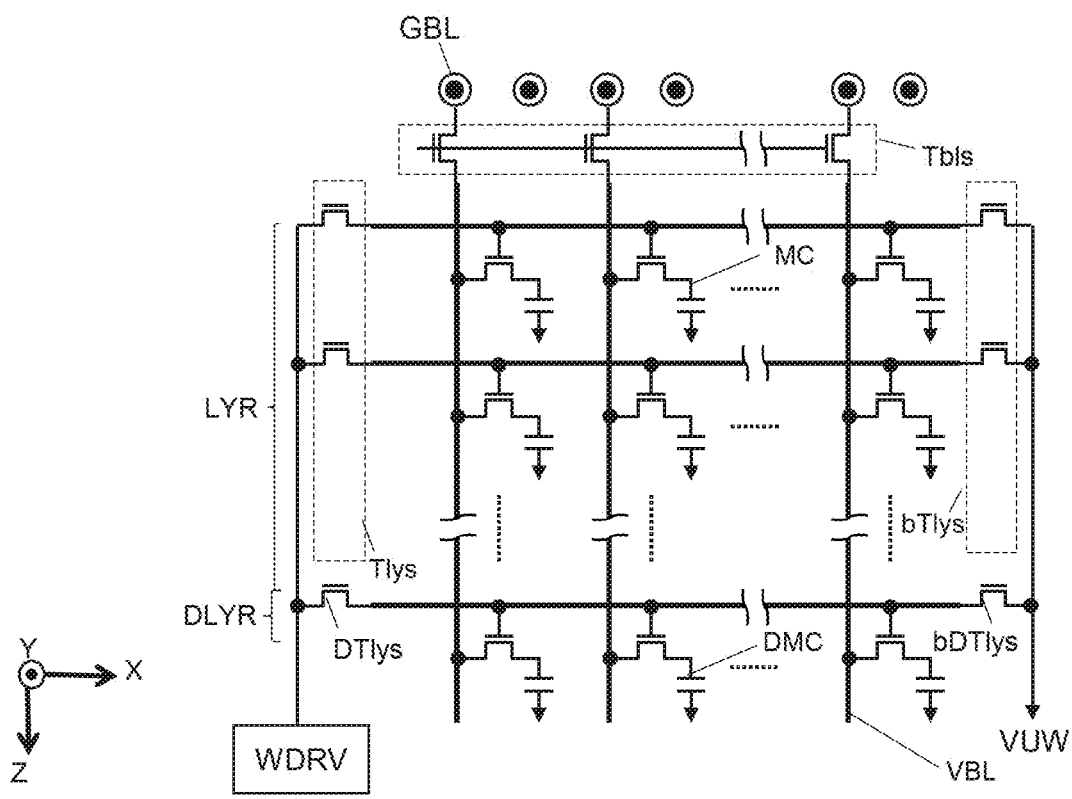
FIG. 5 is a schematic front view illustrating a configuration example of the memory cell array.

FIG. 5 is a schematic front view illustrating a configuration example of the memory cell array MCA. FIG. 5 illustrates a configuration as viewed from the Y direction. In the present embodiment, for example, the bit lines VBL are arranged for every second global bit line GBL of the global bit lines GBL arrayed in the X direction along the word line WL. The bit lines VBL are connected through the bit-line selection transistors Tbls to the global bit lines GBL at intervals or intermittently.

The word line WL is connected to a plurality of memory cells MC arrayed in the X direction. The dummy word line DWL is connected to a plurality of dummy memory cells DMC arrayed in the X direction. The word lines WL and the dummy word line DWL are connected at their one end to the word line driver WDRV through the layer selection transistors Tlys and DTlys, respectively. The word line driver WDRV selectively applies a selected word voltage VWLSEL (see FIG. 6) to any of the word lines WL in the memory cell layers LYR. The selected word voltage VWLSEL is a voltage to be applied to the gate of the cell transistor in reading the data from the memory cell MC. The word lines WL and the dummy word line DWL are connected at the other end to the non-selective voltage source VUW through the layer selection transistors bTlys and bDTlys, respectively. With this configuration, the word line driver WDRV can apply the selected word voltage VWLSEL as the first voltage to only a selected word line WL, and can transmit the data from the selected memory cell MC to the bit line VBL and the global bit line GBL.

Figures 6, 7:
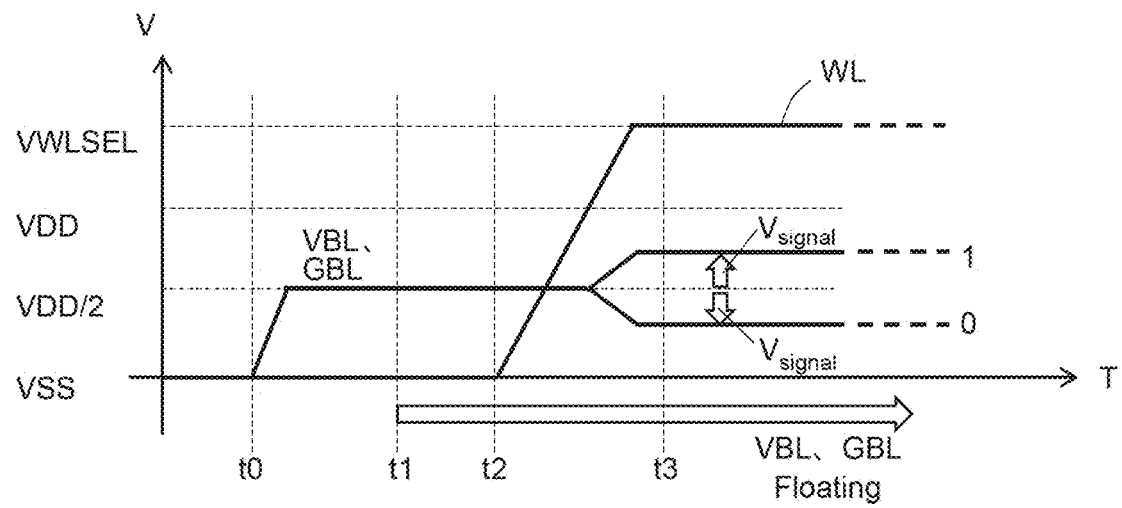
FIG. 6 is a graph illustrating a voltage of the selected word line and the selected bit lines.
FIG. 7 is a table illustrating a relation between the data in the selected memory cell and the voltage of the bit line and other line.

FIG. 6 is a graph illustrating a voltage of the selected word line WL and the selected bit lines VBL and GBL in a read operation. In this graph, the vertical axis represents the voltage, while the horizontal axis represents time. FIG. 7 is a table illustrating a relation between the data in the selected memory cell MC and the voltage of the bit line VBL and other line at time points t1 and t3.

As illustrated in FIG. 6, in a read operation, first, the voltage of the bit lines VBL and GBL is all set to the intermediate voltage VDD/2 between a high-level voltage VDD and a low-level voltage VSS. The intermediate voltage VDD/2 is also an intermediate voltage between a voltage of the global bit line GBL when the first logic (for example, data "1") is read (read voltage) and a voltage of the global bit line GBL when the second logic (for example, data "0") is read. This intermediate voltage is used as a reference voltage for detecting the logic of the data in the selected memory cell MC. The sense amplifier SA compares the read voltage according to the logic of the data in the selected memory cell MC with the reference voltage, and amplifies the voltage difference between them. Furthermore, based on the voltage difference between the read voltage and the reference voltage, the sense amplifier SA detects the logic of the data in the selected memory cell MC.

At t0, the voltage of the bit line VBL and the global bit line GBL is set to the reference voltage (intermediate voltage) VDD/2.

At t1, the bit line VBL and the global bit line GBL are brought into an electrically floating state. At this time, as illustrated in FIG. 7, for example, when the data in the selected memory cell MC is "1", the cell capacitor Cmc has an electric charge accumulated therein, and is thus charged such that the source voltage of the cell transistor Tmc reaches the high-level voltage VDD. In contrast, for example, when the data in the selected memory cell MC is "0", the cell capacitor Cmc does not have an electric charge accumulated therein, and is thus discharged such that the source voltage of the cell transistor Tmc reaches almost 0 V. A voltage VBL of the bit line VBL and the global bit line GBL is maintained at the reference voltage (intermediate voltage) VDD/2.

At t2 of FIG. 6, the voltage of the word line WL is raised to the selected word voltage VWLSEL higher than the high-level voltage VDD. This brings the cell transistor Tmc of the selected memory cell MC into a conductive state. At t3, the voltage of the bit line VBL and the global bit line GBL becomes a read voltage according to the charge accumulated in the cell capacitor Cmc. For example, when the data in the selected memory cell MC is "1", the voltage of the bit line VBL and the global bit line GBL becomes higher than the intermediate voltage VDD/2 by a signal voltage Vsig. When the data in the selected memory cell MC is "0", the voltage of the bit line VBL and the global bit line GBL becomes lower than the intermediate voltage VDD/2 by the signal voltage Vsig. At this time, since the cell transistor Tmc is brought into a conductive state, a source voltage Vs of the cell transistor Tmc is approximately equal to the voltage VBL of the bit line VBL and the global bit line GBL as illustrated in FIG. 7.

At t3 and thereafter, the sense amplifier SA compares such a read voltage Vr (Vr=VDD/2+Vsig or VDD/2-Vsig) with the reference voltage VDD/2, and can thereby detect the logic of the data in the selected memory cell MC.

However, in practice, when the voltage of the word line WL is raised to the selected word voltage VWLSEL higher than the high-level voltage VDD, then capacitive coupling between the word line WL and the bit line VBL through the cell transistor Tmc causes the voltage of the bit line VBL to rise. Particularly, in the three-dimensional memory cell array MCA as described in the present embodiment, the cell transistor Tmc has a size larger than that of a cell transistor of a planar memory cell array. For example, it has been found that the gate length and gate width of the cell transistor Tmc are both increased relative to those of the planar memory cell array. In this case, the capacitive coupling between the word line WL and the bit line VBL increases as the gate size of the cell transistor Tmc increases. The capacitive coupling between the word line WL and the bit line VBL increases, so that in a read operation, when the voltage of the word line WL is raised to the selected word voltage VWLSEL, the voltage of the bit line VBL rises more significantly. There is a possibility that such coupling noise may cause the voltage of the bit line VBL to increase equal to or higher than the read voltage, which hinders accurate detection of the data.

In view of the above, in the present embodiment, the dummy cell layer DLYR is provided in the three-dimensional memory cell array MCA. The word line driver WDRV selects some of the dummy word lines DWL in the dummy cell layer DLYR. The dummy cell DMC is provided between this selected dummy word line DWL and a non-selected bit line VBL that transmits the reference signal. The word line driver WDRV applies a dummy voltage DV in phase with the selected word voltage VWLSEL to this selected dummy word line DWL. With this operation, a voltage equivalent to the coupling noise that enters the selected global bit line GBL or the selected bit line VBL that transmits the data can be intentionally added to the non-selected global bit line GBL or the non-selected bit line VBL that transmits the reference signal.

Figure 8:
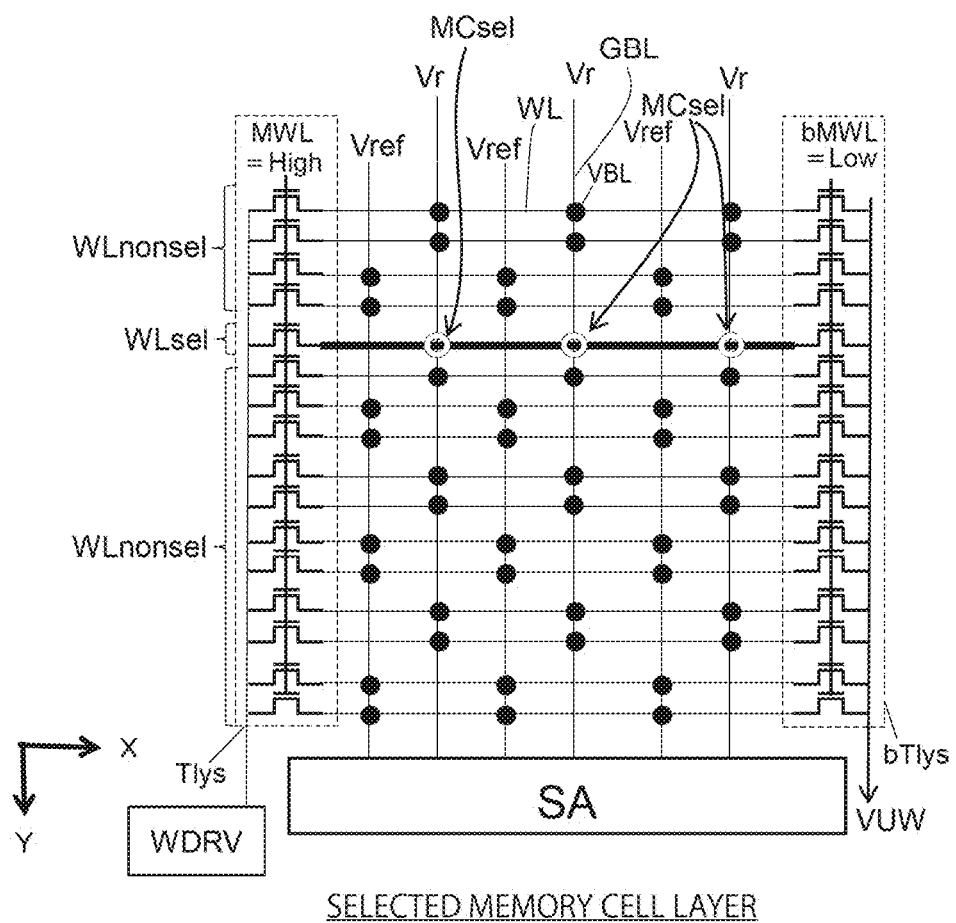
FIGS. 8 to 10 are schematic plan views illustrating a state of each layer of the memory cell array in a data read operation.
Figure 9:
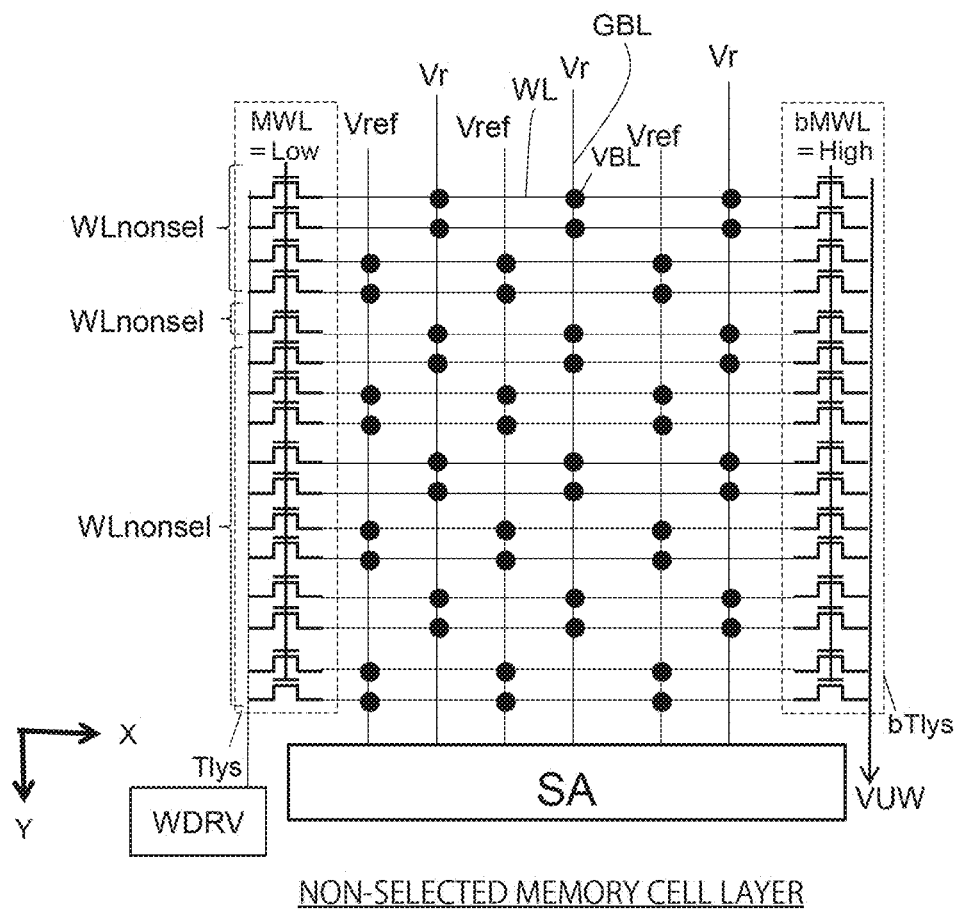
Figure 10:
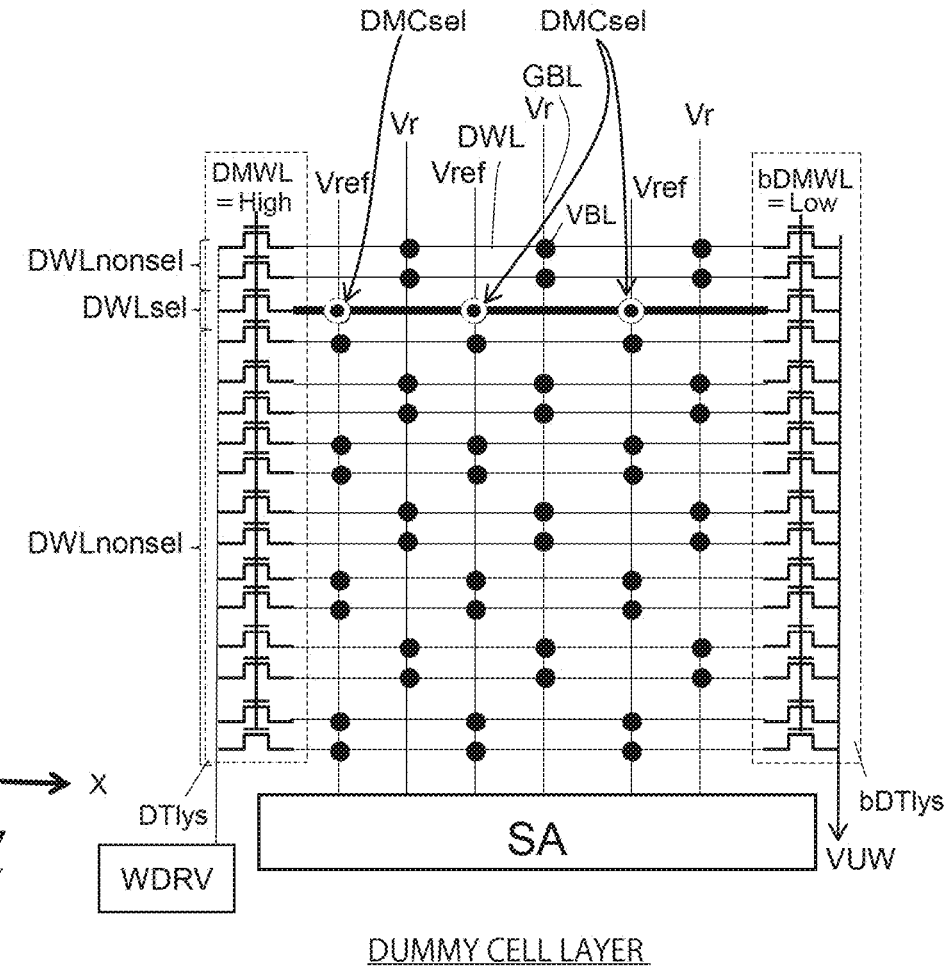

For example, FIGS. 8 to 10 are schematic plan views illustrating a state of each layer of the memory cell array MCA in a data read operation. FIG. 8 illustrates a state of one selected memory cell layer. FIG. 9 illustrates a state of non-selected memory cell layers other than the selected memory cell layer. FIG. 10 illustrates a state of a dummy cell layer.

In a data read operation, all of the word lines WL in the selected memory cell layer are electrically connected to the word line driver WDRV selectively by the layer selection transistors Tlys. All of the word lines WL in the non-selected memory cell layer are electrically disconnected from the word line driver WDRV by the layer selection transistors Tlys. In the non-selected memory cell layer, all of the word lines WL are connected to the non-selective voltage source VUM by the layer selection transistors bTlys. All of the dummy word lines DWL in the dummy cell layer are electrically connected to the word line driver WDRV by the dummy-cell layer selection transistors DTlys.

The word line driver WDRV is provided to be shared between the memory cell layers LYR to selectively transmit the selected word voltage VWLSEL to a certain row of word line WL in each of the memory cell layers LYR. At this time, in the selected memory cell layer in FIG. 8, the layer selection transistors Tlys are in a conductive state, and thus the selected word voltage VWLSEL is transmitted to a selected row of selected word line WLsel. Even in the selected memory cell layer, the word line driver WDRV still applies a voltage of the non-selective voltage source VUW to the non-selected word lines WLnonsel other than the selected word line.

Consequently, the read voltage Vr according to the data from selected memory cells MCsel connected to the selected word line WLsel is transmitted to the bit lines VBL and the global bit lines GBL. In FIG. 8, the read voltage Vr is read from three selected memory cells MCsel. The other memory cells MC are non-selected memory cells.

In contrast, the voltage of the bit lines VBL and the global bit lines GBL, which are not connected to the selected memory cells MCsel, is set to the reference voltage (intermediate voltage) VDD/2. These bit lines VBL and global bit lines GBL transmit a reference voltage Vref.

The global bit lines GBL that transmit the read voltage Vr and the global bit lines GBL that transmit the reference voltage Vref are alternately arrayed in the X direction. When one of the two adjacent global bit lines GBL transmits the read voltage Vr, the other global bit line GBL transmits the reference voltage Vref. Conversely, when one of the two adjacent global bit lines GBL transmits the reference voltage Vref, the other global bit line GBL transmits the read voltage Vr. In this manner, two adjacent global bit lines GBL form a pair of bit lines and are used to detect 1-bit data. In the pair of bit lines, one of the bit lines transmits the read voltage Vr, while the other bit line transmits the reference voltage Vref. In the present embodiment, a pair of bit lines is provided in the same memory cell array MCA, and is of a so-called Folded bit line configuration. Hereinafter, a bit line VBL, which is connected to one of the global bit lines GBL that form a pair of bit lines, and another bit line VBL, which is connected to the other global bit line GBL, are also sometimes referred to as "a pair of bit lines".

When the selected word voltage VWLSEL is applied to the selected word line WLsel, then capacitive coupling in the cell transistor Tmc of the selected memory cell MCsel generates coupling noise in the bit line VBL. When a coupling noise component is represented as Vn, the read voltage Vr of the bit line VBL or the global bit line GBL connected to the selected memory cell MCsel is expressed as VDD/2±Vsig+Vn. The read voltage is a voltage on the bit line VBL or the global bit line GBL when the data in the selected memory cell MCsel is read.

In the non-selected memory cell layer in FIG. 9, since the layer selection transistors Tlys are in a non-conductive state, the selected word voltage VWLSEL from the word line driver WDRV is not transmitted to any of the word lines WL. Since the layer selection transistors bTlys are in a conductive state, the word lines WL in the non-selected memory cell layer are maintained at the voltage of the non-selective voltage source VUM.

The word line driver WDRV in FIG. 10 selectively transmits the dummy voltage DV to a certain row of dummy word line DWL in the dummy cell layer DLYR. At this time, in the dummy cell layer DLYR, since the dummy-cell layer selection transistors DTlys are in a conductive state, the dummy voltage DV is transmitted to a single selected dummy word line DWLsel. The word line driver WDRV applies the voltage of the non-selective voltage source VUW to the non-selected dummy word lines DWLnonsel other than the selected dummy word line.

The selected dummy word line DWLsel is a dummy word line DWL provided with the dummy cells DMC between this selected dummy word line DWLsel and the bit lines VBL that transmit the reference voltage Vref. That is, selected dummy cells DMCsel are connected between the selected dummy word line DWLsel and the bit lines VBL that transmit the reference voltage Vref. In contrast, no dummy cells DMC are connected between the selected dummy word line DWLsel and the bit lines VBL that transmit the read voltage Vr. When the dummy voltage DV is applied to this selected dummy word line DWLsel as described above, then capacitive coupling in the cell transistor Tmc of the selected dummy cell DMCsel generates coupling noise in the bit line VBL that transmits the reference voltage Vref. When a coupling noise component is represented as DVn, the reference voltage of the bit line VBL or the global bit line GBL connected to the selected dummy cell DMCsel is expressed as VDD/2+DVn.

In this manner, in the present embodiment, the read voltage is expressed as VDD/2±Vsig+Vn, while the reference voltage is expressed as VDD/2+DVn. Since the dummy voltage DV is in phase with the selected word voltage VWLSEL, the noise component DVn of the reference voltage Vref also has the same voltage phase (voltage of the same polarity) as the noise component Vn. Therefore, when the sense amplifier SA compares the read voltage Vr with the reference voltage Vref to detect the voltage difference between them, the noise component DVn of the reference voltage is canceled from the noise component Vn of the read voltage. Consequently, since the coupling noise component Vn contained in the read voltage is reduced, the proportion of the component of the signal voltage Vsig in the read voltage Vr is increased. This enables the sense amplifier SA to accurately detect the signal voltage Vsig.

It is preferable that the noise component DVn of the reference voltage is substantially equal to the noise component Vn of the read voltage. This enables almost all the noise component Vn to be cancelled, and thus enables the signal voltage Vsig to be detected more accurately. However, even if the noise component DVn is unequal to the noise component Vn, the effect of reducing the noise component Vn can still be obtained. Therefore, as long as the noise component DVn is in phase with the noise component Vn, it is permissible that the noise component DVn is not necessarily equal to the noise component Vn.

The dummy cell DMC has the intermediate voltage VDD/2 stored therein in advance. Accordingly, even when the selected dummy cell DMC is connected to the non-selected bit line VBL that transmits the reference voltage Vref, the selected dummy cell DMC does not affect the reference voltage Vref that is the intermediate voltage. The voltage of the dummy cell DMC may be regularly retained so as to be maintained at the intermediate voltage VDD/2, or may be written in such a manner as to become the intermediate voltage VDD/2 immediately before the read operation.

Figure 11:
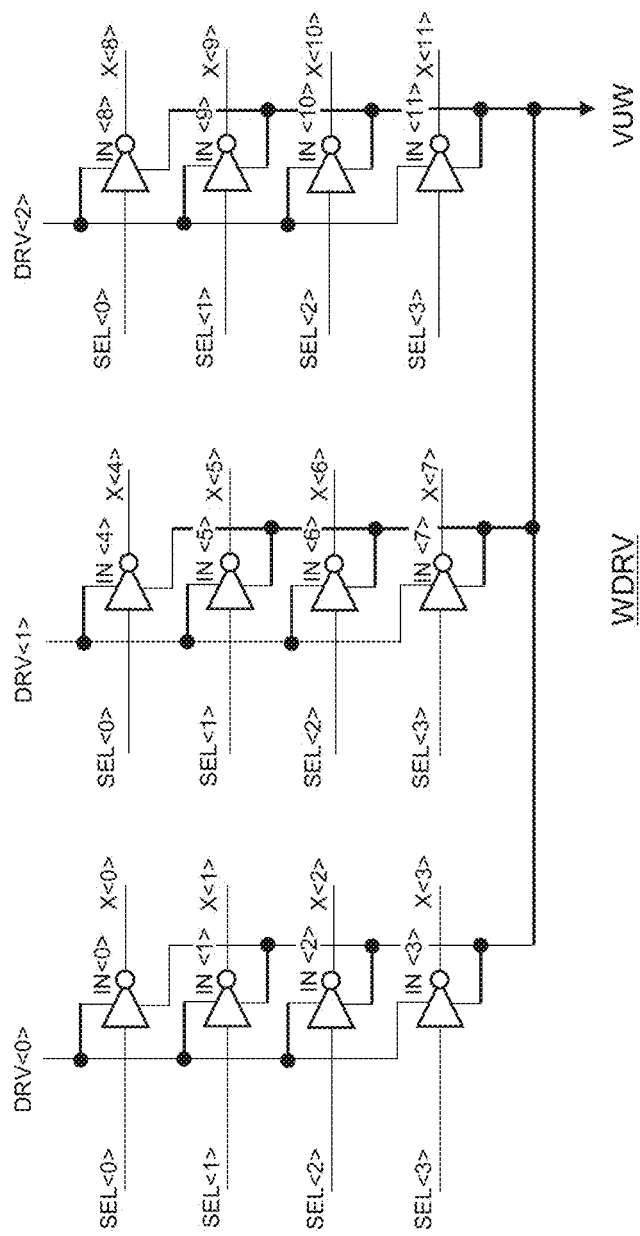
FIG. 11 is a circuit diagram illustrating a configuration example of the word line driver.

FIG. 11 is a circuit diagram illustrating a configuration example of the word line driver WDRV. The word line driver WDRV is connected to the layer selection transistors Tlys or DTlys. The word line driver WDRV selectively applies the selected word voltage VWLSEL to the selected word line WLsel in the selected memory cell layer LYR selected by the layer selection transistors Tlys. The word line driver WDRV selectively applies the dummy voltage DV to the selected dummy word line DWLsel in the selected dummy cell layer DLYR selected by the dummy-cell layer selection transistors DTlys. A word line driver WDRV is provided for each memory cell layer LYR and for the dummy cell layer DLYR. These word line drivers WDRV in the memory cell layers LYR and the dummy cell layer DLYR have an identical configuration. Therefore, the configuration of the word line driver WDRV provided in the dummy cell layer DLYR is described below, and thus the description of the word line driver WDRV provided in the memory cell layers LYR is omitted.

The word line driver WDRV includes inverters IN<0> to IN<11> that receive selection signals SEL<0> to SEL<3> and output drive voltages DRV<0> to DRV<2> or the voltage of the non-selective voltage source VUW.

The drive voltages DRV<0> to DRV<2> are input respectively to the inverters IN<0> to IN<3>, IN<4> to IN<7>, and IN<8> to IN<11>. Any one of the drive voltages DRV<0> to DRV<2> is selectively activated to the dummy voltage DV, while the other two drive voltages are inactivated to the voltage of the non-selective voltage source VUW. Accordingly, one of the three sets of the inverters IN<0> to IN<3>, IN<4> to IN<7>, and IN<8> to IN<11> outputs the dummy voltage DV. The inverters IN<0> to IN<3> receive the selection signals SEL<0> to SEL<3>, and output the drive voltage DRV<0> or the voltage of the non-selective voltage source VUW as outputs X<0> to X<3>. The inverters IN<4> to IN<7> receive the selection signals SEL<0> to SEL<3>, and output the drive voltage DRV<1> or the voltage of the non-selective voltage source VUW as outputs X<4> to X<7>. The inverters IN<8> to IN<11> receive the selection signals SEL<0> to SEL<3>, and output the drive voltage DRV<2> or the voltage of the non-selective voltage source VUW as outputs X<8> to X<11>.

Any one of the selection signals SEL<0> to SEL<3> is lowered to a low-level signal, while the other three selection signals are raised to a high-level signal. Accordingly, one of the drive voltages DRV<0> to DRV<2> outputs the dummy voltage DV. Also, corresponding one set of the inverters (IN<0> to IN<3>, IN<4> to IN<7> or IN<8> to IN<11>) receives the dummy voltage DV. An inverter IN<i>(where i is any of 0 to 11), which is one of the inverters in the above set, only outputs a high-level dummy voltage DV as an output X<i>. Accordingly, in the word line driver WDRV, the dummy voltage DV is output as the output X<i> which is one of the outputs X<0> to X<11>, while the voltage of the non-selective voltage source VUW is output as the other 11 outputs X<k>(k≠i). In the manner as described above, the word line driver WDRV combines the drive voltages DRV<0> to DRV<2> with the selection signals SEL<0> to SEL<3> to raise any of the outputs X<0> to X<11> to the dummy voltage DV. Accordingly, the word line driver WDRV can selectively drive one of the dummy word lines DWL in the dummy cell layer DLYR.

The word line driver WDRV corresponding to the memory cell layers LYR also has basically an identical configuration to that in the dummy cell layer DLYR. The word line driver WDRV corresponding to the selected memory cell layer LYR combines the drive voltages DRV<0> to DRV<2> with the selection signals SEL<0> to SEL<3> to raise any of the outputs X<0> to X<11> to the selected word voltage VWLSEL. Accordingly, the word line driver WDRV can selectively drive one of the word lines WL in the selected memory cell layer.

As described above, in the semiconductor storage device 1 according to the present embodiment, the three-dimensional memory cell array MCA is provided with the dummy cell layer DLYR. In the dummy cell layer DLYR, the dummy voltage DV in phase with the selected word voltage VWLSEL is applied to the dummy word line DWL provided with the dummy cells DMC between this dummy word line DWL and the non-selected bit lines VBL that transmit the reference signal. With this configuration, a voltage equivalent to the coupling noise that enters the selected global bit line GBL or the selected bit line VBL that transmits the data can be intentionally added to the non-selected global bit line GBL or the non-selected bit line VBL that transmits the reference signal. As a result, in the sense amplifier SA, coupling noise Vn contained in the read voltage Vr is canceled to a certain extent by coupling noise DVn contained in the reference voltage Vref. This makes it possible to improve the sense margin to the signal voltage Vsig and thus accurately detect the signal voltage Vsig.

The dummy cell DMC has the intermediate voltage VDD/2 stored therein in advance. Accordingly, even when the selected dummy cell DMC is connected to the non-selected bit line VBL that transmits the reference voltage Vref, the selected dummy cell DMC does not affect the reference voltage Vref.

Modification

Figure 12:
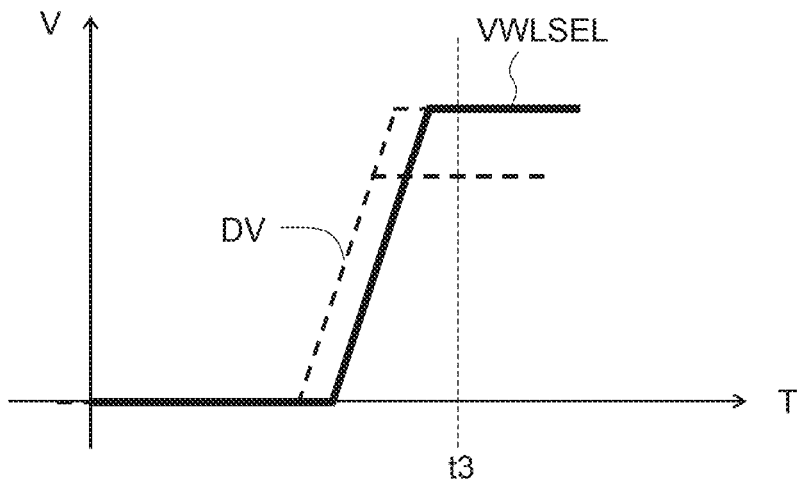
FIG. 12 is a graph illustrating a relation between the selected word voltage and the dummy voltage.

FIG. 12 is a graph illustrating a relation between the selected word voltage VWLSEL and the dummy voltage DV. In this graph, the vertical axis represents the voltage, while the horizontal axis represents time. The selected word voltage VWLSEL and the dummy voltage DV are in phase with each other, and preferably substantially equal to each other. However, as described above, the dummy voltage DV may be unequal to the selected word voltage VWLSEL as long as the dummy voltage DV has the same polarity as the selected word voltage VWLSEL. Further, the dummy voltage DV may rise nearly simultaneously with the selected word voltage VWLSEL. However, the dummy voltage DV may rise at a different timing from the selected word voltage VWLSEL. It is sufficient that the dummy voltage DV rises before the time point t3 at which the sense amplifier SA detects the read voltage Vr.

Second Embodiment

Figure 13:
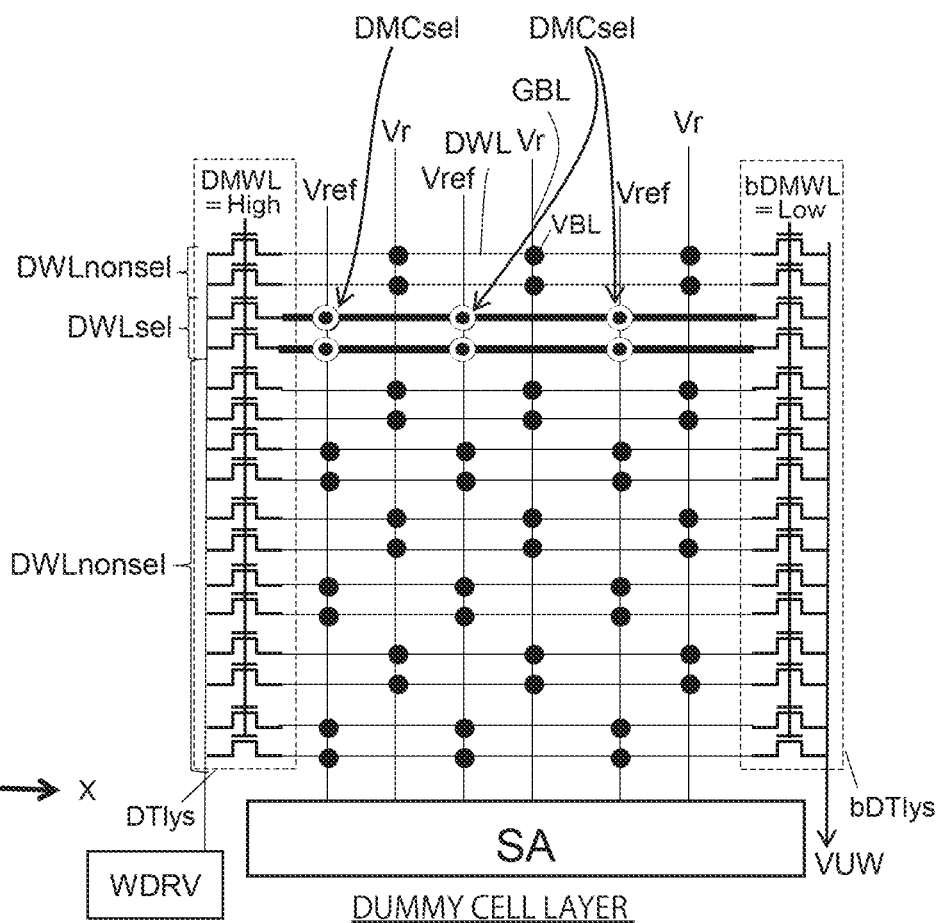
FIG. 13 is a schematic plan view illustrating a state of the dummy cell layer in a data read operation according to a second embodiment.

FIG. 13 is a schematic plan view illustrating a state of the dummy cell layer DLYR in a data read operation according to a second embodiment. In the second embodiment, in the data read operation, plural dummy word lines DWL are selected from among a plurality of dummy word lines DWL in the dummy cell layer DLYR, and the plural selected dummy word lines DWLsel are applied with the dummy voltage DV. When n (n is an integer equal to or larger than 2) dummy word lines DWL are selected, it suffices that the dummy voltage DV is approximately one n-th of the selected word voltage VWLSEL.

For example, in the example of FIG. 13, two dummy word lines DWL are selected as the selected dummy word lines DWLsel. These two selected dummy word lines DWLsel are applied with approximately one-half of the selected word voltage VWLSEL.

When the capacitance between the word line WL and the bit line VBL is represented as C1, and the capacitance between the bit line VBL and the reference voltage source (for example, the ground) is represented as C2, the voltage of the selected bit line VBL is increased by the selected word voltage VWLSEL by $VWLSEL \times C1/(C1+C2)$. That is, the coupling noise Vn in the read voltage Vr is expressed as $VWLSEL \times C1/(C1+C2)$.

The dummy cell DMC has the same configuration as that of the memory cell MC. Accordingly, in a case where there is one selected dummy word line DWLsel, the coupling noise DVn in the reference voltage Vref is generated to the dummy voltage DV in the same manner as the coupling noise Vn in the read voltage Vr. That is, the coupling noise DVn in the reference signal is expressed as $DV \times C1/(C1+C2)$.

In contrast, as described in the second embodiment, in a case where two dummy word lines DWL are selected as the selected dummy word lines DWLsel, the coupling capacitance between the two selected dummy word lines DWLsel and one selected bit line VBL is expressed as $2 \times C1/(C1+C2)$. Therefore, the coupling noise DVn in the reference signal is expressed as $DV \times 2 \times C1/(C1+C2)$. That is, in a case where there are two selected dummy word lines DWLsel, the coupling noise DVn in the reference signal becomes doubled from that with one selected dummy word line. Conversely, assuming that the dummy voltage DV is halved, when the number of selected dummy word lines DWLsel is increased to two, for example, then the coupling noise DVn in the reference signal can still be maintained.

Therefore, in the second embodiment, two selected dummy word lines DWLsel are set to decrease the dummy voltage DV to approximately one-half of the selected word voltage VWLSEL. With this configuration, coupling noise DVn, which is equivalent to the coupling noise DVn generated when the selected word voltage VWLSEL is applied to one selected dummy word line DWLsel, can be added to the reference voltage Vref.

The rest of the configuration and operations in the second embodiment may be identical to that in the first embodiment. Accordingly, the second embodiment can achieve effects identical to those of the first embodiment. According to the second embodiment, the voltage of the selected dummy word line DWLsel can be reduced to one-half of the selected word voltage VWLSEL. This reduces the chance that the power-supply voltage may be increased to a higher level, and accordingly leads to a reduction in power consumption.

The number of selected dummy word lines DWLsel may be equal to or larger than three. In a case where the number of selected dummy word lines DWLsel is n (n is an integer equal to or larger than 2), it suffices that the dummy voltage DV is approximately one n-th of the selected word voltage VWLSEL. In this manner, the dummy voltage DV can be reduced by increasing the number of selected dummy word lines DWLsel.

Third Embodiment

Figure 14:
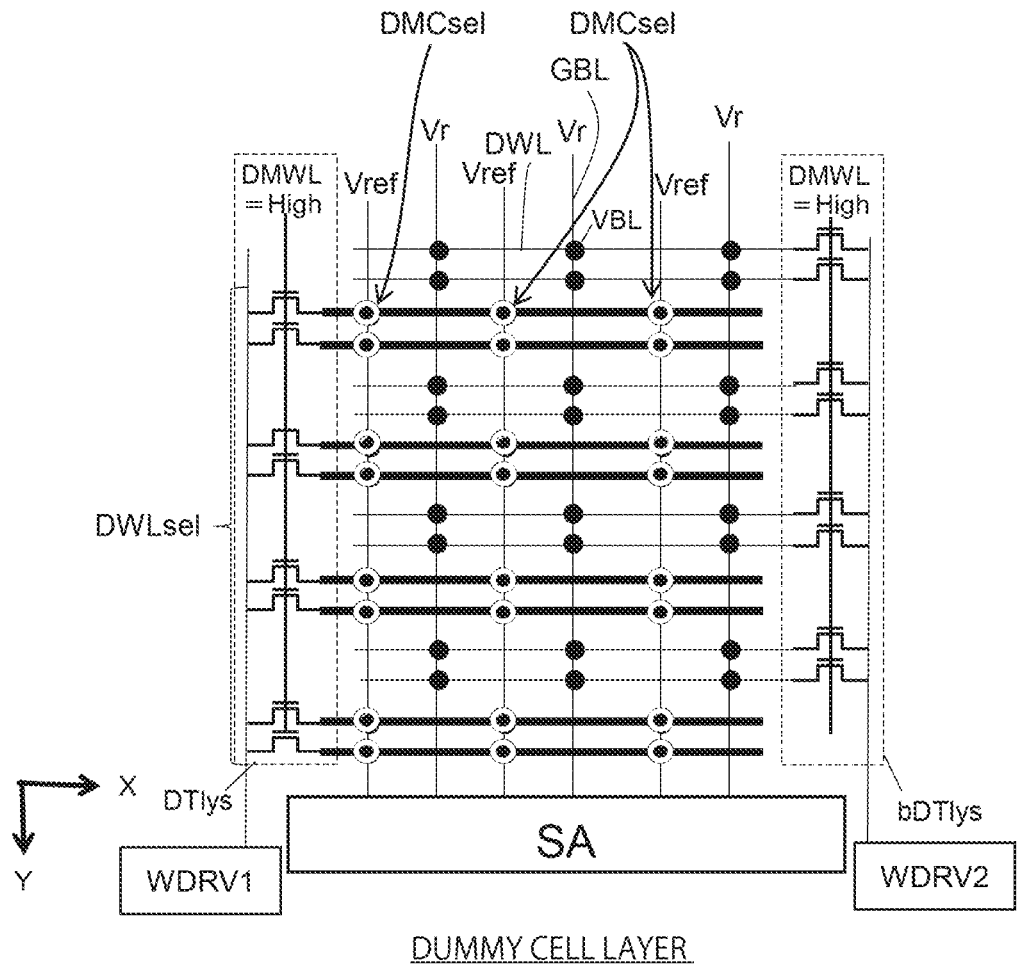
FIG. 14 is a schematic plan views illustrating a state of the dummy cell layer in a data read operation according to a third embodiment.
Figure 15:
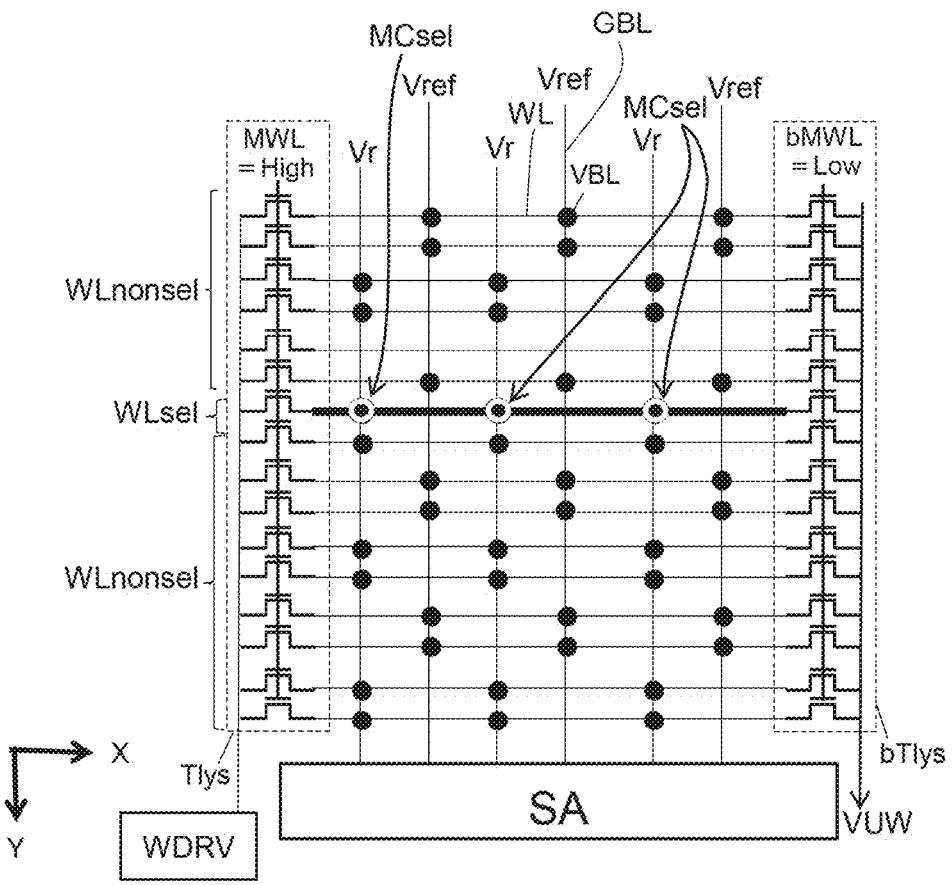
FIG. 15 is a schematic plan view illustrating a state of the selected memory cell layer in the data read operation according to the third embodiment.
Figure 16:
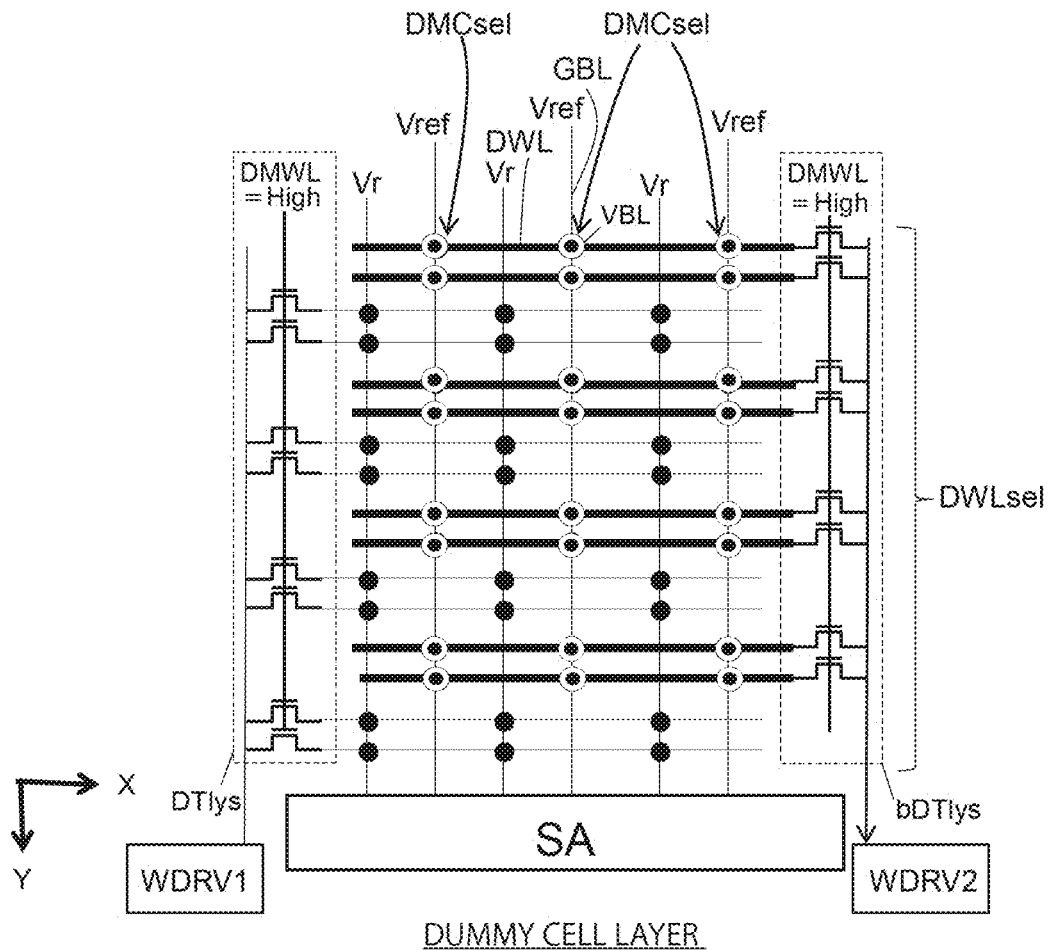
FIG. 16 is a schematic plan views illustrating a state of the dummy cell layer in a data read operation according to the third embodiment.

FIGS. 14 and 16 are schematic plan views illustrating a state of the dummy cell layer DLYR in a data read operation according to a third embodiment. FIG. 15 is a schematic plan view illustrating a state of the selected memory cell layer LYR in the data read operation according to the third embodiment.

In the third embodiment, in the data read operation, the dummy word lines DWL, provided with the dummy cells DMC between these dummy word lines DWL and the non-selected bit lines VBL that transmit the reference voltage Vref, are all selected as the selected dummy word lines DWLsel. The word line driver WDRV applies the dummy voltage DV to the selected dummy word lines DWLsel. That is, the word line driver WDRV applies the dummy voltage DV to all of these dummy word lines DWL in the dummy cell layer DLYR. At this time, when the number of selected dummy word lines DWLsel is n, it suffices that the dummy voltage DV is approximately one n-th of the selected word voltage VWLSEL.

In the third embodiment, as illustrated in FIG. 10 or FIG. 13, the word line driver WDRV may be connected to one side of the dummy word lines DWL, while the non-selective voltage source VUW may be connected to the other side thereof. In this case, the word line driver WDRV has the structure illustrated in FIG. 11, and activates two of the selection signals SEL<0> to SEL<3> to a low-level signal.

However, as illustrated in FIG. 14, word line drivers WDRV1 and WDRV2 may be provided at opposite ends of the dummy word lines DWL. In this case, a first word line driver WDRV1 is connected to a dummy word line DWL, to which the dummy cells DMC are connected between this dummy word line DWL and one of a pair of bit lines, while the first word line driver WDRV1 is electrically disconnected from a dummy word line DWL to which the dummy cells DMC are connected between this dummy word line DWL and the other of the pair of bit lines. A second word line driver WDRV2 is electrically disconnected from a dummy word line DWL, provided with the dummy cells DMC between this dummy word line DWL and one of a pair of bit lines, while the second word line driver WDRV2 is connected to a dummy word line DWL provided with the dummy cells DMC between this dummy word line DWL and the other of the pair of bit lines.

With the configuration as described above, it suffices that the first and second word line drivers WDRV1 and WDRV2 apply either the dummy voltage DV or the voltage of the non-selective voltage source VUW to all of the dummy word lines DWL connected to the first and second word line drivers WDRV1 and WDRV2. For example, when one of a pair of bit lines transmits the read voltage Vr as illustrated in FIG. 8, the first word line driver WDRV1 applies the dummy voltage DV to all of the dummy word lines DWL provided with the dummy cells DMC between these dummy word lines DWL and the other bit line VBL that transmits the reference voltage Vref in the pair of bit lines as illustrated in FIG. 14.

In the state illustrated in FIG. 14, the first word line driver WDRV1 is connected to all of the dummy word lines DWL corresponding to the bit lines that transmit the reference voltage Vref, while being disconnected from all of the dummy word lines DWL corresponding to the bit lines that transmit the read voltage Vr. Therefore, the first word line driver WDRV1 applies the dummy voltage DV to all of the dummy word lines DWL connected to the first word line driver WDRV1. In contrast, the second word line WDRV2 applies the voltage of the non-selective voltage source VUW to all of the dummy word lines DWL connected to the second word line driver WDRV2.

In contrast, for example, when the other of a pair of bit lines transmits the read voltage Vr as illustrated in FIG. 15, the second word line driver WDRV2 applies the dummy voltage DV to all of the dummy word lines DWL provided with the dummy cells DMC between these dummy word lines DWL and the bit lines VBL that transmit the reference voltage Vref in the pair of bit lines, as illustrated in FIG. 16.

In the state illustrated in FIG. 16, the second word line driver WDRV2 is connected to all of the dummy word lines DWL corresponding to the bit lines that transmit the reference voltage Vref, while being disconnected from all of the dummy word lines DWL corresponding to the bit lines that transmit the read voltage Vr. Therefore, the second word line driver WDRV2 applies the dummy voltage DV to all of the dummy word lines DWL connected to the second word line driver WDRV2. In contrast, in this case, the first word line driver WDRV1 applies the voltage of the non-selective voltage source VUW to all of the dummy word lines DWL connected to the first word line driver WDRV1.

Figure 17:
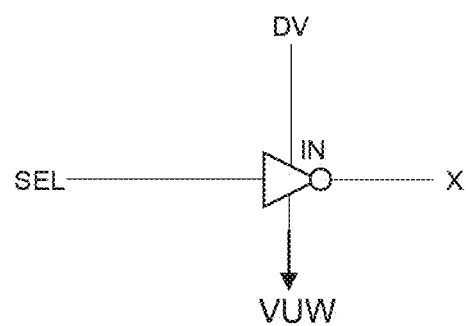
FIG. 17 is a circuit diagram illustrating a configuration example of the word line drivers according to the third embodiment.

FIG. 17 is a circuit diagram illustrating a configuration example of the word line drivers WDRV1 and WDRV2 according to the third embodiment. In the third embodiment, as described above, it suffices that the first and second word line drivers WDRV1 and WDRV2 selectively apply the dummy voltage DV or the voltage of the non-selective voltage source VUW to all of the dummy word lines DWL connected to the first word line drivers WDRV1 and to the second word line drivers WDRV2. Therefore, the internal configuration of each of the first and second word line drivers WDRV1 and WDRV2 can be made up of one inverter IN as illustrated in FIG. 17. In this case, when the selection signal SEL is a low-level signal, the dummy voltage DV is output as the output X. When the selection signal SEL is a high-level signal, the voltage of the non-selective voltage source VUW is output as the output X.

As described above, according to the third embodiment, the configuration of the word line driver WDRV is simplified, and the number of transistors that make up the word line driver WDRV is reduced. This leads to downscaling of the semiconductor storage device 1. When the number of selected dummy word lines DWLsel is n, it suffices that the dummy voltage DV is approximately one n-th of the selected word voltage VWLSEL. This leads to a reduction in power consumption in the semiconductor storage device 1.

The rest of the configuration in the third embodiment may be identical to the corresponding one in the first embodiment. Accordingly, the third embodiment can achieve effects identical to those of the first embodiment.

Fourth Embodiment

Figure 18:
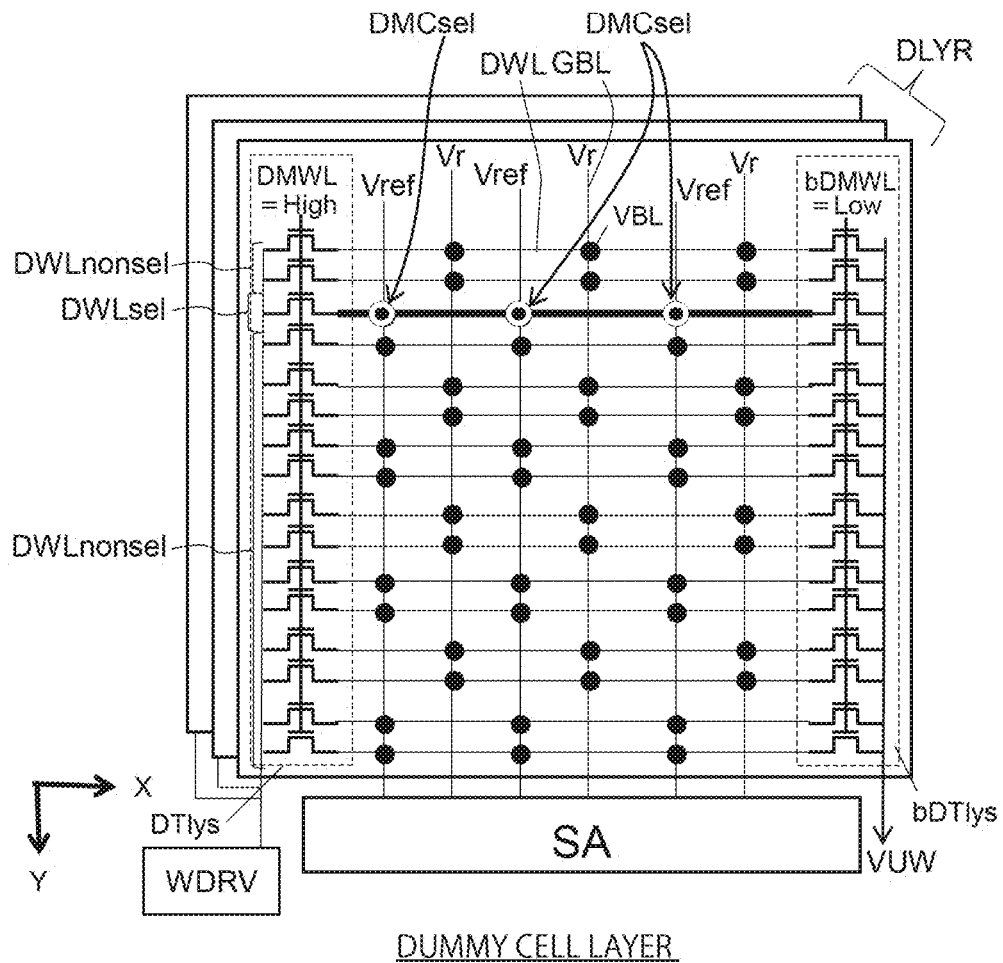
FIG. 18 is a schematic diagram illustrating a configuration example of the dummy cell layer according to a fourth embodiment.

FIG. 18 is a schematic diagram illustrating a configuration example of the dummy cell layer DLYR according to a fourth embodiment. In the fourth embodiment, a plurality of dummy cell layers DLYR are provided in one memory cell array MCA. The respective configurations of the dummy cell layers DLYR may be identical to that illustrated in FIG. 10. The word line driver WDRV may be shared between the dummy cell layers DLYR. Accordingly, in a data read operation, the word line driver WDRV selects the dummy word lines DWL in the same row in the dummy cell layers DLYR as the selected dummy word lines DWLsel. The word line driver WDRV applies the dummy voltage DV to the selected dummy word lines DWLsel. When the number of dummy cell layers DLYR is n, the number of selected dummy word lines DWLsel is also n. Therefore, it suffices that the dummy voltage DV is approximately one n-th of the selected word voltage VWLSEL. The dummy voltage DV can be adjusted by changing the number of dummy cell layers DLYR.

In this manner, the plurality of dummy cell layers DLYR may be provided to increase the number of selected dummy word lines DWLsel and accordingly reduce the level of dummy voltage DV. The rest of the configuration in the fourth embodiment may be identical to that in the first embodiment. Accordingly, the fourth embodiment can achieve effects identical to those of the first embodiment.

Further, the fourth embodiment may be combined with the second or third embodiment. This combination can further increase the number of selected dummy word lines DWLsel and can further reduce the level of dummy voltage DV.

Fifth Embodiment

Figure 19:
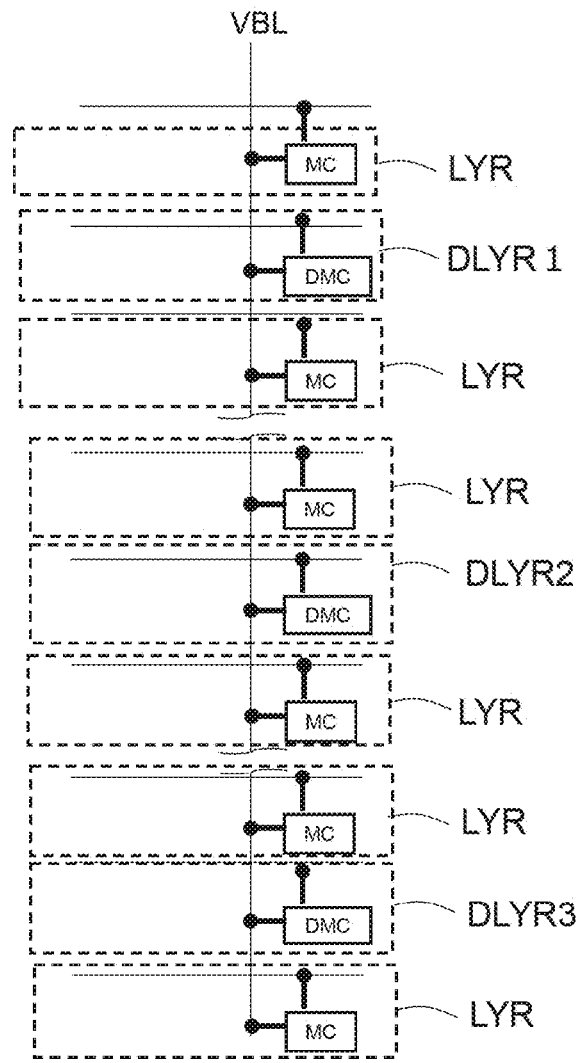
FIG. 19 is a diagram illustrating a configuration example of the memory cell array according to a fifth embodiment.

FIG. 19 is a diagram illustrating a configuration example of the memory cell array MCA according to a fifth embodiment. In the fifth embodiment, a plurality of dummy cell layers DLYR are arranged in a distributed manner in the Z direction (stacking direction) in the memory cell array MCA. For example, a dummy cell layer DLYR1 is provided in the upper layer of the memory cell array MCA, a dummy cell layer DLYR2 is provided in the intermediate layer thereof, and a dummy cell layer DLYR3 is provided in the lower layer thereof. The dummy cell layers DLYR are not only arranged in the upper layer and the lower layer of the memory cell array MCA, but are also arranged between a plurality of memory cell layers LYR In this manner, the dummy cell layers DLYR are arranged in a distributed manner in the Z direction. Accordingly, even when there are variations in electrical characteristics of the memory cells MC in the memory cell layer LYR depending on the location in the Z direction, the electrical characteristics of the dummy cells DMC in the dummy cell layer DLYR can still be adapted to the electrical characteristics of the memory cells MC in the vicinity of the dummy cells DMC.

For example, the bit line VBL extends in the Z direction, and penetrates the memory cell layers LYR and the dummy cell layers DLYR in the memory cell array MCA. A bit line hole for forming this bit line VBL may have a tapered inner surface such that the hole diameter is larger in the upper layer of the memory cell array MCA, while becoming smaller toward the lower layer thereof. Therefore, the diameter of the bit line VBL is larger in the upper layer of the memory cell array MCA and becomes smaller toward the lower layer thereof. Due to this tapered shape of the bit line VBL, there may be variations in electrical characteristics of the memory cells MC (for example, the channel area of the cell transistor Tmc) between the upper layer and the lower layer of the memory cell array MCA.

However, according to the fifth embodiment, the dummy cell layers DLYR are arranged in a distributed manner in the Z direction. Accordingly, the electrical characteristics of the dummy cells DMC in the dummy cell layer DLYR can be adapted to the electrical characteristics of the memory cells MC in the vicinity of the dummy cells DMC. Accordingly, the noise component DVn in the reference voltage can appropriately cancel the noise component Vn in the read voltage.

The rest of the configuration in the fifth embodiment may be identical to that in the first embodiment. Accordingly, the fifth embodiment can obtain the effects identical to those of the first embodiment. Further, the fifth embodiment may be combined with any one of the second to fourth embodiments. With this combination, the fifth embodiment can obtain effects of any one of the second to fourth embodiments. For example, in a read operation, the dummy word lines DWL may be selected from any one of the dummy cell layers DLYR1 to DLYR3 to apply the dummy voltage DV to the selected dummy word lines DWL. The dummy word lines DWL may be selected from any plural dummy cell layers among the dummy cell layers DLYR1 to DLYR3 to apply the dummy voltage DV to the selected dummy word lines DWL. There may be two dummy cell layers DLYR, or four or more dummy cell layers DLYR.

Sixth Embodiment

Figure 20:
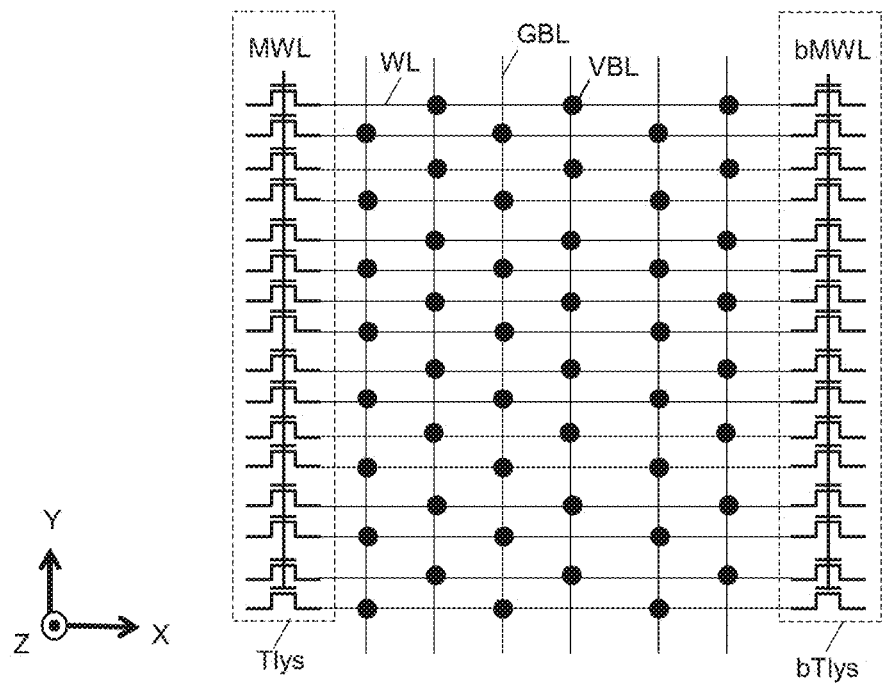
FIG. 20 is a schematic plan view illustrating a configuration example of the memory cell array according to a sixth embodiment.

FIG. 20 is a schematic plan view illustrating a configuration example of the memory cell array MCA according to a sixth embodiment. FIG. 20 illustrates a plan view as viewed from the Z direction. The present embodiment is the same as the first embodiment in that the bit lines VBL are arranged at intervals or intermittently at the intersection locations of the word lines WL and the global bit lines GBL. However, in the sixth embodiment, for example, the bit lines VBL are arranged at every second intersection location of the above intersection locations arrayed in the X direction along the word line WL, while being arranged at every second intersection location of the above intersection locations arrayed in the Y direction along the global bit line GBL.

Figure 21:
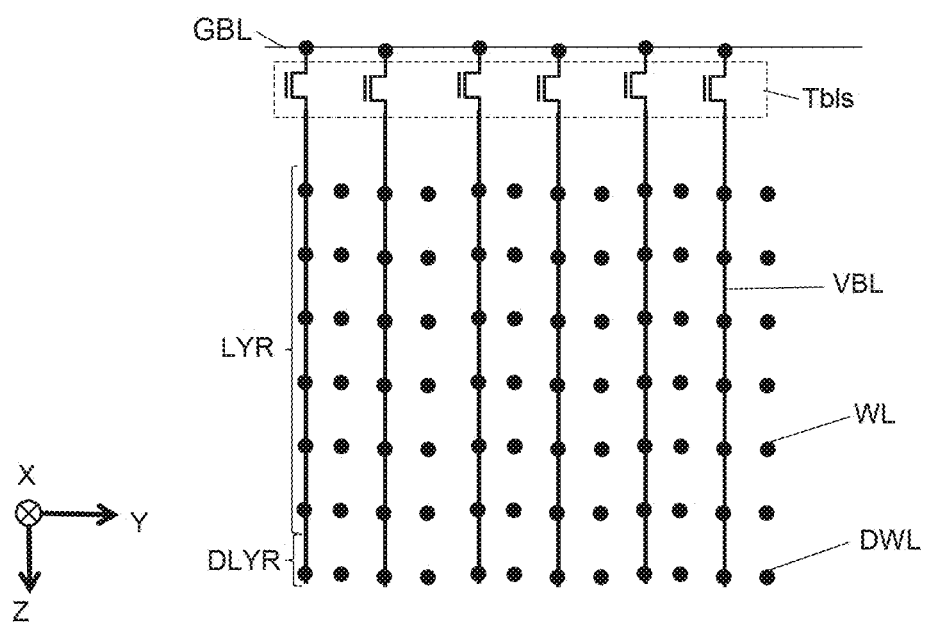
FIG. 21 is a schematic side view illustrating a configuration example of the memory cell array according to the sixth embodiment.

FIG. 21 is a schematic side view illustrating a configuration example of the memory cell array MCA according to the sixth embodiment. FIG. 21 illustrates a configuration as viewed from the X direction. In the sixth embodiment, for example, the bit lines VBL are arranged at every second intersection location of the above intersection locations arrayed in the Y direction along the global bit line GBL.

The front view of the memory cell array MCA may be identical to that in FIG. 5.

As described above, in a plan view as viewed from the Z direction, the bit lines VBL may be arranged one by one at the intersection locations of the word lines WL and the global bit lines GBL in a staggered manner at intervals or intermittently. In this case, in side view from the X direction, the bit lines VBL are connected to the array of the global bit line GBL in the Y direction at intervals or intermittently of one column.

Two adjacent global bit lines GBL form a pair of bit lines and are used to detect 1-bit data. In the pair of bit lines, one of the bit lines transmits the read voltage Vr, while the other bit line transmits the reference voltage Vref. Also in the sixth embodiment, the pair of bit lines is of a so-called Folded bit line configuration.

The rest of the configuration in the sixth embodiment may be identical to that in the first embodiment. Accordingly, the sixth embodiment can achieve effects identical to those of the first embodiment. The sixth embodiment may be combined with any one of the second to fifth embodiments. With this combination, the sixth embodiment can achieve effects identical to those of any one of the second to fifth embodiments.

Seventh Embodiment

Figure 22:
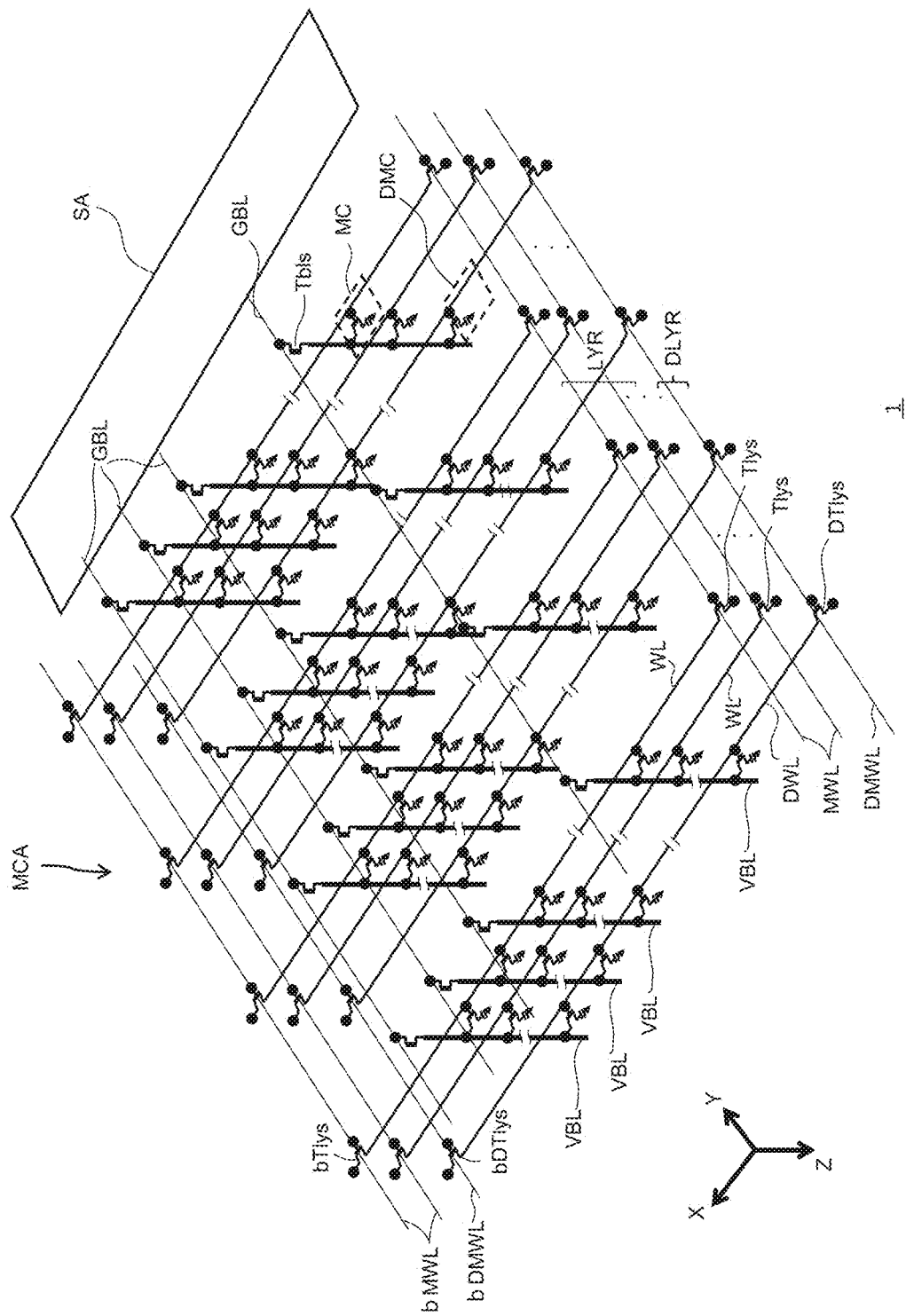
FIG. 22 is a schematic perspective view illustrating a configuration example of the semiconductor storage device according to a seventh embodiment.
Figure 23:
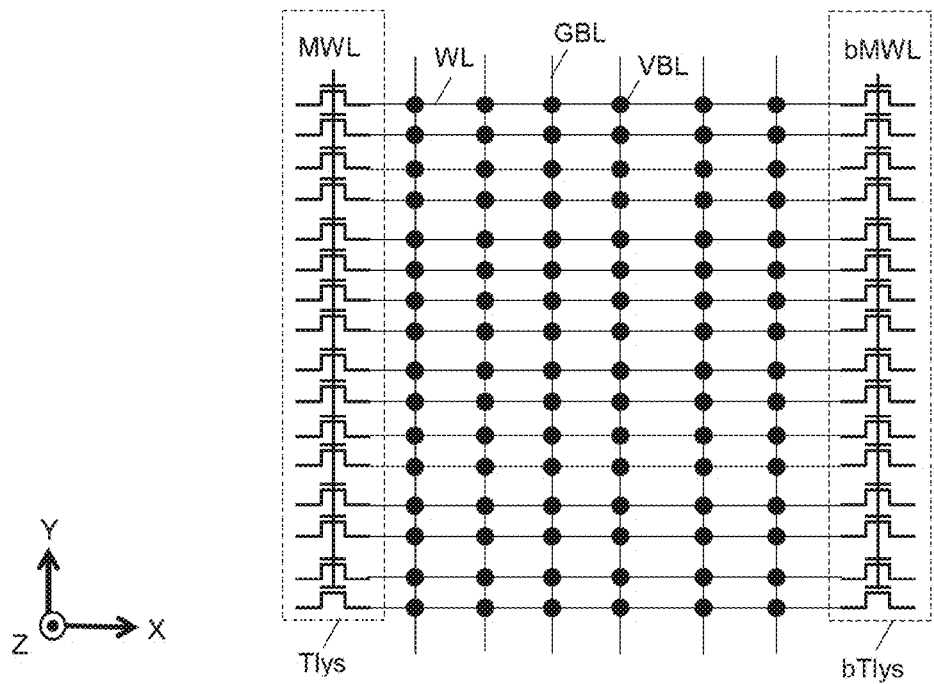
FIG. 23 is a schematic plan view illustrating a configuration example of the memory cell array according to the seventh embodiment.
Figure 24:
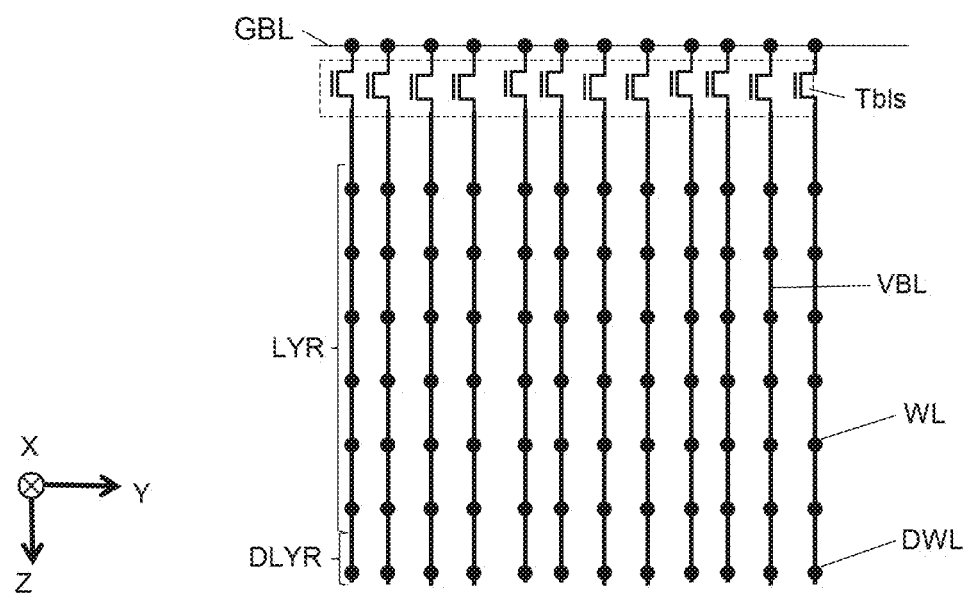
FIG. 24 is a schematic side view illustrating a configuration example of the memory cell array according to the seventh embodiment.
Figure 25:
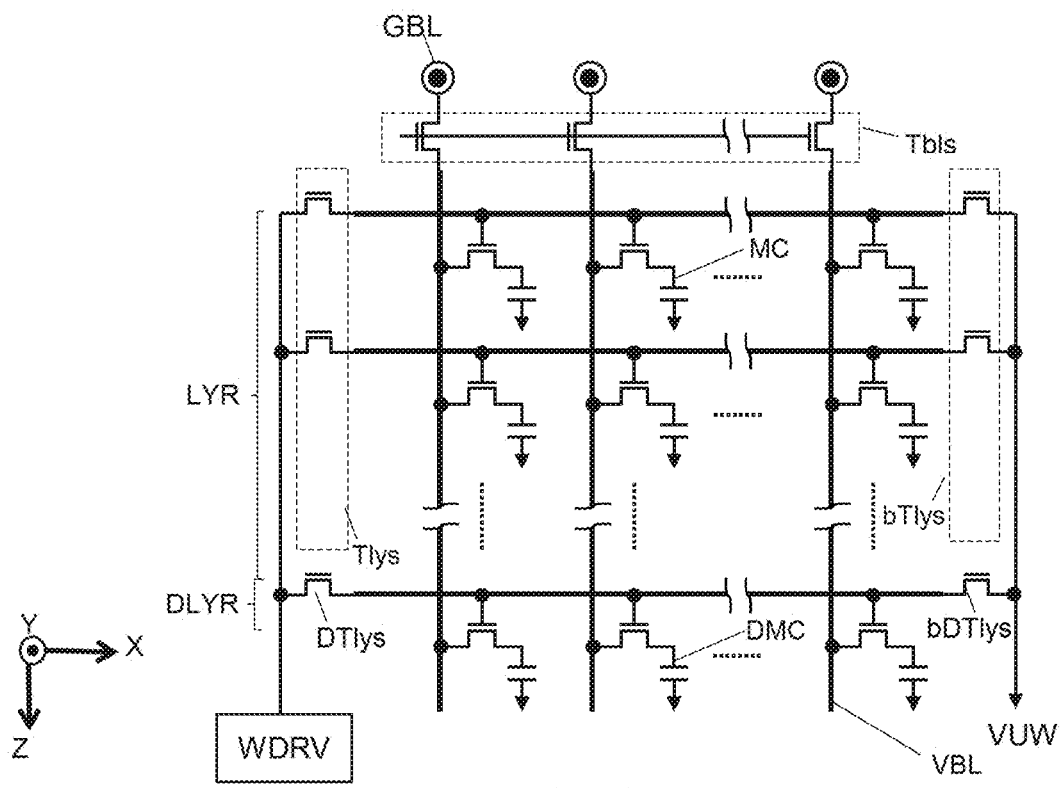
FIG. 25 is a schematic front view illustrating a configuration example of the memory cell array.

FIG. 22 is a schematic perspective view illustrating a configuration example of the semiconductor storage device 1 according to a seventh embodiment. FIG. 23 is a schematic plan view illustrating a configuration example of the memory cell array MCA according to the seventh embodiment. FIG. 23 illustrates a plan view as viewed from the Z direction. FIG. 24 is a schematic side view illustrating a configuration example of the memory cell array MCA according to the seventh embodiment. FIG. 24 illustrates a configuration as viewed from the X direction. FIG. 25 is a schematic front view illustrating a configuration example of the memory cell array MCA. FIG. 25 illustrates a configuration as viewed from the Y direction.

The seventh embodiment is different from the first embodiment in that each of the bit lines VBL is arranged corresponding to each of the intersection locations of the word lines WL and the global bit lines GBL as illustrated in FIGS. 22 to 25. In this case, for example, each of the bit lines VBL is arranged at each of the above intersection locations arrayed in the X direction along the word line WL, while being arranged at each of the above intersection locations arrayed in the Y direction along the global bit line GBL. The rest of the configuration in the seventh embodiment may be identical to that in the first embodiment.

As described above, in a case where each of the bit lines VBL is arranged corresponding to each of the intersection locations of the word lines WL and the global bit lines GBL, the read voltage Vr is output from the selected memory cells MC between the selected word line WL and each of the bit lines VBL through all of the global bit lines GBL in a read operation. The reference voltage Vref cannot be output from a read-target memory cell array MCA.

Figure 26:
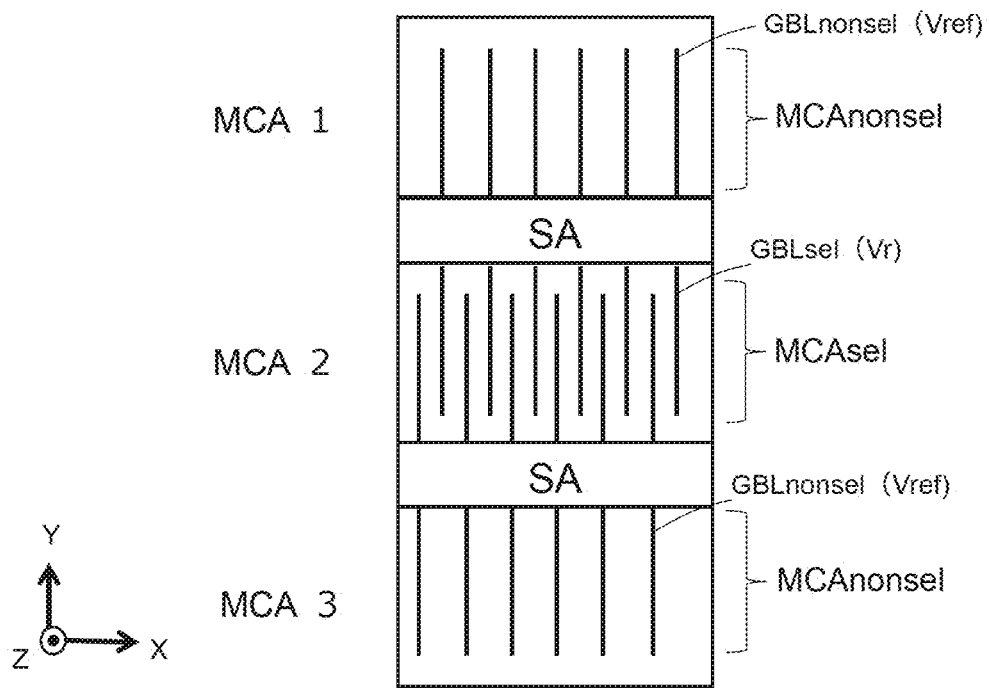
FIG. 26 is a block diagram illustrating a configuration example of a plurality of memory cell arrays.

Therefore, in the seventh embodiment, the reference voltage Vref is generated by using another memory cell array MCA. For example, FIG. 26 is a block diagram illustrating a configuration example of a plurality of memory cell arrays MCA1 to MCA3. Sense amplifiers SA are located on opposite sides of the memory cell array MCA2. The memory cell array MCA1 is adjacent to the memory cell array MCA2 in the Y direction (the extending direction of the global bit line GBL) with one of the sense amplifiers SA interposed therebetween. The memory cell array MCA3 is adjacent to the memory cell array MCA2 in the Y direction with the other sense amplifier SA interposed therebetween.

The memory cell arrays MCA1 to MCA3 have the configuration described with reference to FIGS. 22 to 25, and their configurations may be identical to each other.

The sense amplifier SA between the memory cell array MCA1 and the memory cell array MCA2 is connected to the global bit lines GBL of both the memory cell arrays MCA1 and MCA2, and detects the read voltage Vr from either the memory cell array MCA1 or MCA2 by using the reference voltage Vref from the other memory cell array.

The sense amplifier SA between the memory cell array MCA2 and the memory cell array MCA3 is connected to the global bit lines GBL of both the memory cell arrays MCA2 and MCA3, and detects the read voltage Vr from either the memory cell array MCA2 or MCA3 by using the reference voltage Vref from the other memory cell array.

For example, the memory cell array MCA1 transmits the read voltage Vr from any of the memory cell layers LYR illustrated in FIGS. 24 and 25 to the global bit lines GBL. The memory cell array MCA2 transmits the reference voltage Vref from the dummy cell layer DLYR illustrated in FIGS. 24 and 25 to the global bit lines GBL.

As illustrated in FIG. 26, a selected global bit line GBLsel is adjacent to a non-selected global bit line GBLselnon in their extending direction (Y direction).

As described above, in the seventh embodiment, a pair of bit lines is provided individually in the adjacent memory cell arrays MCA, and is of a so-called Open bit line configuration. In the Open bit line configuration, for example, the memory cell array MCA2 with the selected global bit line GBLsel is different from the memory cell arrays MCA1 and MCA3 corresponding to the non-selected global bit line GBLnonsel. Therefore, the word lines WL and the dummy word line DWL corresponding to the selected global bit line GBLsel are different from the word lines WL and the dummy word line DWL corresponding to the non-selected global bit line GBLnonsel.

When the memory cell array MCA2 serving as a selected memory cell array MCAsel transmits the read voltage Vr, the memory cell array MCA1 or MCA3 serving as a non-selected memory cell array MCAselnon generates the reference voltage Vref. The two sense amplifiers compare the read voltage Vr transmitted from the memory cell array MCA2 with the reference voltage Vref transmitted from the memory cell array MCA1 or MCA3. With this operation, the two sense amplifiers can detect the logic of the data in the selected memory cell MCsel.

As described above, the present embodiment can be applied even to the Open bit line configuration. The rest of the configuration in the seventh embodiment may be identical to that in the first embodiment. Accordingly, the seventh embodiment can achieve effects identical to those of the first embodiment. Further, the seventh embodiment may be combined with any one of the second to sixth embodiments. In this case, the seventh embodiment can also achieve effects of any one of the second to sixth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
 a plurality of first cell layers, each of which includes a plurality of first cells arrayed in a first plane and used as memory cells;
 at least one second cell layer stacked on the first cell layer, and including a plurality of second cells arrayed in a second plane, the second cells not being used as memory cells;
 a plurality of first wires, each of which is connected to the first cells arrayed in a first direction in the first plane;
 a plurality of second wires, each of which is connected to the second cells arrayed in the first direction in the second plane;
 a plurality of third wires, each of which is connected to the first cells and the second cell arrayed in a second direction in which the first and second cell layers are stacked;
 a plurality of fourth wires, each of which is connected to the third wires arrayed in a third direction intersecting the first and second directions; and
 a control circuit, wherein
 the control circuit applies a first voltage to a selected first wire of the first wires when reading data from a selected cell selected from the first cells, the selected first wire being connected to the selected cell, and transmits a read voltage according to the data to a selected fourth wire of the fourth wires, the selected fourth wire being connected to the selected cell, the control circuit transmits a reference voltage used as a reference for detecting the read voltage to a non-selected fourth wire of the fourth wires, other than the selected fourth wire, and the control circuit applies a second voltage to a selected second wire of the second wires, the selected second wire being provided with the second cell between the selected second wire and the non-selected fourth wire.

2. The device of claim 1, wherein the second voltage has a same polarity as that of the first voltage.

3. The device of claim 1, wherein
the second voltage is applied to the selected second wire that is one of the second wires, and
the first voltage and the second voltage are substantially equal to each other.

4. The device of claim 1, wherein
the second voltage is applied to the selected second wires of the second wires, where number of the selected second wires is n (n is an integer equal to or larger than 2), and
the second voltage is approximately one n-th of the first voltage.

5. The device of claim 1, wherein the second voltage is applied to all of the second wires in the second cell layer.

6. The device of claim 1, comprising a plurality of the second cell layers.

7. The device of claim 6, wherein the second cell layers are arranged between the first cell layers.

8. The device of claim 1, wherein the second voltage is applied before detection of the read voltage.

9. The device of claim 1, further comprising a sense amplifier connected to the fourth wires and configured to compare the read voltage with the reference voltage.

10. The device of claim 1, wherein the reference voltage is an intermediate voltage between the read voltage when data in the selected cell is a first logic and the read voltage when data in the selected cell is a second logic.

11. The device of claim 1, wherein the selected fourth wire and the non-selected fourth wire are adjacent to each other in the first direction.

12. The device of claim 11, wherein the selected fourth wire and the non-selected fourth wire are provided to be shared to the first wires and the second wires.

13. The device of claim 11, wherein
the first cell is provided at an intersection location of the first wire and the fourth wire at intervals as viewed from the second direction, and
the second cell is provided at an intersection location of the second wire and the fourth wire at intervals as viewed from the second direction.

14. The device of claim 1, wherein the selected fourth wire and the non-selected fourth wire are adjacent to each other in the third direction.

15. The device of claim 14, wherein
the first wires corresponding to the selected fourth wire are different from the first wires corresponding to the non-selected fourth wire, and
the second wires corresponding to the selected fourth wire are different from the second wires corresponding to the non-selected fourth wire.

16. The device of claim 14, wherein
the first cell is provided at each intersection location of the first wire and the fourth wire as viewed from the second direction, and
the second cell is provided at each intersection location of the second wire and the fourth wire as viewed from the second direction.

17. The device of claim 1, wherein
the first cell includes a first transistor in which a gate is connected to the first wire, and either a source or a drain is connected to the third wire, and a first capacitor connected to the other of the source and the drain of the first transistor, and
the second cell includes a second transistor in which a gate is connected to the second wire, and either a source or a drain is connected to the third wire, and a second capacitor connected to the other of the source and the drain of the second transistor.

* * * * *